US012802932B2

(12) United States Patent
Chen et al.

(10) Patent No.: US 12,802,932 B2
(45) Date of Patent: Nov. 17, 2026

(54) METHOD AND SYSTEM FOR PLASMA PROCESS

(71) Applicant: Tokyo Electron Limited, Tokyo (JP)

(72) Inventors: Zhiying Chen, Austin, TX (US); Qiang Wang, Austin, TX (US); Shyam Sridhar, Austin, TX (US); Joel Blakeney, Austin, TX (US); Megan Carruth, Austin, TX (US); Peter Lowell George Ventzek, Austin, TX (US); Mitsunori Ohata, Taiwa-cho (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 370 days.

(21) Appl. No.: 18/406,783

(22) Filed: Jan. 8, 2024

(65) Prior Publication Data

US 2025/0226179 A1 Jul. 10, 2025

(51) Int. Cl.

*H01J 37/32* (2006.01)
*H10P 50/20* (2026.01)
*H10P 50/26* (2026.01)

(52) U.S. Cl.

CPC .. *H01J 37/32128* (2013.01); *H01J 37/32137* (2013.01); *H01J 37/32155* (2013.01); *H10P 50/20* (2026.01); *H10P 50/266* (2026.01); *H10P 50/267* (2026.01)

(58) Field of Classification Search

None
See application file for complete search history.

(56) References Cited

U.S. PATENT DOCUMENTS

| | | | |
|---|---|---|---|
| 7,691,226 | B2 | 4/2010 | Denpoh |
| 10,304,660 | B1 | 5/2019 | Shoeb et al. |
| 10,896,807 | B2 | 1/2021 | Fairbairn et al. |
| 10,998,170 | B2 | 5/2021 | Yoshida et al. |
| 11,476,090 | B1 | 10/2022 | Ramaswamy et al. |
| 11,610,761 | B2 | 3/2023 | Fairbairn et al. |
| 2017/0358431 | A1 | 12/2017 | Dorf et al. |
| 2019/0157040 | A1 | 5/2019 | Fairbairn et al. |
| 2019/0318913 | A1 | 10/2019 | Yoshida et al. |
| 2019/0318916 | A1 | 10/2019 | Yoshida et al. |
| 2020/0051787 | A1 | 2/2020 | Shinagawa |

(Continued)

FOREIGN PATENT DOCUMENTS

| | | | |
|---|---|---|---|
| TW | 202329762 | A | 7/2023 |
| WO | 2022256086 | A1 | 12/2022 |
| WO | 2023003832 | A1 | 1/2023 |

OTHER PUBLICATIONS

Seong, I. et al., "Development of a Noninvasive Real-Time Ion Energy Distribution Monitoring System Applicable to Collisional Plasma Sheath," Sensors, 22, 6254, Aug. 20, 2022, MDPI, 13 pages.

(Continued)

*Primary Examiner* — Jiong-Ping Lu
(74) *Attorney, Agent, or Firm* — Slater Matsil, LLP

(57) ABSTRACT

A method for generating a bias voltage includes generating a radio frequency (RF) sinusoidal wave voltage, generating a DC square wave voltage, and forming a bias waveform by synchronizing the RF sinusoidal wave voltage and the DC square wave voltage. The method further includes providing the bias waveform to an electrode of a plasma processing system.

20 Claims, 20 Drawing Sheets

(56) References Cited

U.S. PATENT DOCUMENTS

| | | | | |
|---|---|---|---|---|
| 2021/0043472 | A1 | 2/2021 | Koshimizu et al. | |
| 2021/0287907 | A1 | 9/2021 | Ramaswamy et al. | |
| 2021/0296092 | A1 | 9/2021 | Koshimizu | |
| 2021/0407769 | A1 | 12/2021 | Kim et al. | |
| 2022/0157561 | A1 | 5/2022 | Cui et al. | |
| 2022/0157577 | A1 | 5/2022 | Cui et al. | |
| 2022/0392750 | A1 | 12/2022 | Yang et al. | |
| 2022/0399183 | A1* | 12/2022 | Cui | H01J 37/32146 |
| 2022/0415614 | A1 | 12/2022 | Yang et al. | |
| 2023/0049157 | A1 | 2/2023 | Sawlani et al. | |
| 2024/0128055 | A1* | 4/2024 | Kim | H01J 37/32128 |

OTHER PUBLICATIONS

Sobolewski, M., "Real-time, noninvasive monitoring of ion energy and ion current at a wafer surface during plasma etching," J.Vac. Sci. Technol., A 24(5), Aug. 21, 2006, 15 pages.

Yu, Q. et al., "Equivalent electric circuit model of accurate ion energy control with tailored waveform biasing," Plasma Sources Sci. Technol., 31, IOP Publishing, Mar. 9, 2022, 14 pages.

International Searching Authority, "Notification of Transmittal of The International Search Report and The Written Opinion of The International Searching Authority, or The Declaration," International application No. PCT/US2024/055164, Date of mailing Feb. 21, 2025, 9 pages.

* cited by examiner

METHOD AND SYSTEM FOR PLASMA PROCESS

CROSS-REFERENCE TO RELATED APPLICATIONS

This application relates to the following co-pending and commonly assigned patent application: U.S. patent application Ser. No. 18/406,670, entitled "Method and System for Plasma Process," filed on Jan. 8, 2024, which application is hereby incorporated herein by reference in its entirety.

TECHNICAL FIELD

The present invention relates generally to plasma processing, and, in particular embodiments, to plasma processing methods, apparatuses, and systems.

BACKGROUND

Device formation within microelectronic workpieces can involve a series of manufacturing techniques including formation, patterning, and removal of a number of layers of material on a substrate. In order to achieve the physical and electrical specifications of current and next generation semiconductor devices, processing flows enabling reduction of feature size while maintaining structural integrity is desirable for various patterning processes. As device structures densify and develop vertically, the desire for precision material processing becomes more compelling.

Plasma processes are commonly used to form devices, interconnects, and contacts in microelectronic workpieces. For example, plasma etching and plasma deposition are common process steps during semiconductor device fabrication. A combination of source power (SP) applied to a coupling element and bias power (BP) applied to a substrate holder can be used to generate and direct plasma. Various conditions during a plasma process may influence whether material is being deposited onto a substrate, etched from the substrate, or a combination of the two.

SUMMARY

In accordance with an embodiment, a method for generating a bias voltage includes: generating a radio frequency (RF) sinusoidal wave voltage; generating a DC square wave voltage; forming a bias waveform by synchronizing the RF sinusoidal wave voltage and the DC square wave voltage; and providing the bias waveform to a bottom electrode of a plasma processing system.

In accordance with another embodiment, a method for plasma processing includes: generating a bias waveform voltage by synchronizing a pulsed DC voltage and an RF sinusoidal wave voltage at a single frequency; generating a plasma in a plasma processing chamber by providing source power to a top electrode of the plasma processing chamber and providing the bias waveform voltage to a bottom electrode of the plasma processing chamber; and controlling an ion energy distribution of the plasma with the bias waveform voltage.

In accordance with yet another embodiment, a method for plasma processing includes: providing a substrate into a plasma processing chamber; generating a plasma in the plasma processing chamber by providing source power to a top electrode of the plasma processing chamber; biasing a bottom electrode of the plasma processing chamber by providing pulsed DC voltage to the bottom electrode; and compensating surface charge on the substrate by providing RF sinusoidal wave voltage to the bottom electrode, the pulsed DC voltage and the RF sinusoidal wave voltage having a shared frequency.

It is to be understood that both the foregoing general description and the following detailed description are exemplary and explanatory only and are not restrictive of the disclosure, as claimed.

BRIEF DESCRIPTION OF THE DRAWINGS

For a more complete understanding of the present invention, and the advantages thereof, reference is now made to the following descriptions taken in conjunction with the accompanying drawings, in which.

Figure 1:
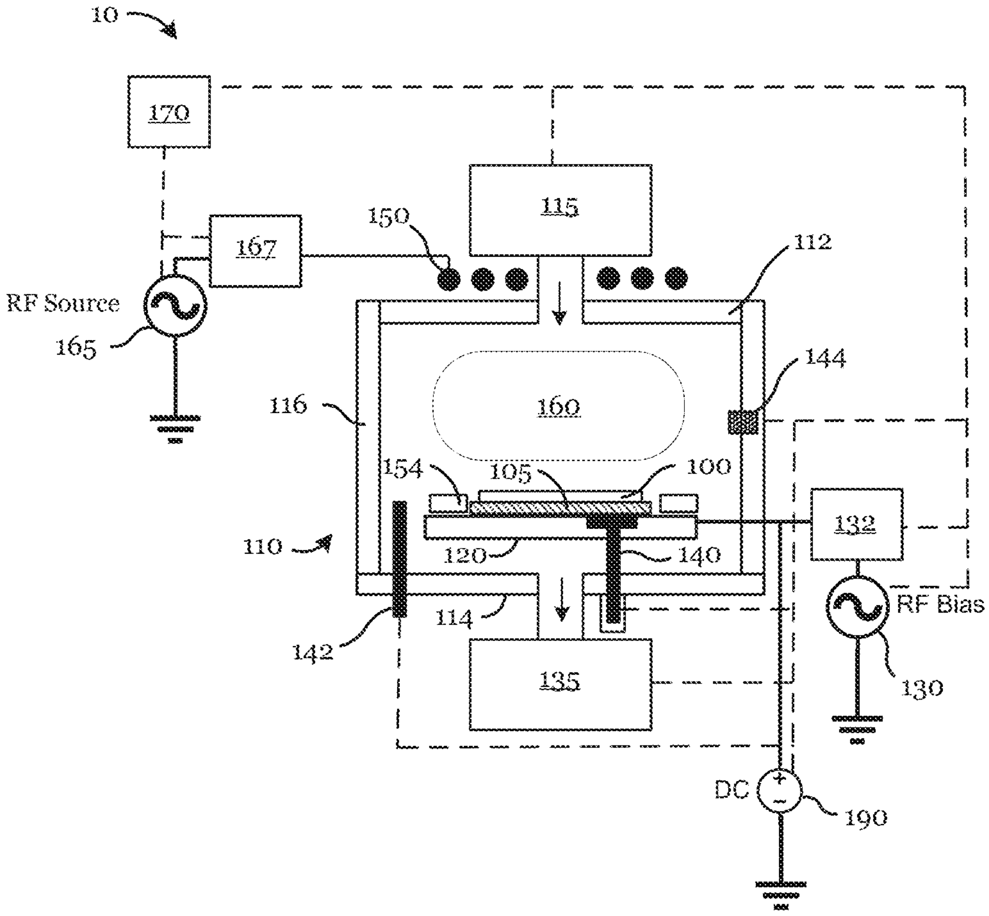
FIG. 1 illustrates an example plasma processing system, in accordance with some embodiments.

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

While inventive aspects are described primarily in the context of semiconductor manufacturing with a plasma processing system, the inventive aspects may be similarly applicable to fields outside the semiconductor industry. Plasma can be used to treat and modify surface properties through functional group addition. For example, to treat surfaces for paint deposit, plasma can convert hydrophobic surfaces to hydrophilic surfaces. Further, the inventive aspects are not limited to plasma. For example, RF can be used to thaw out frozen food or dry out textiles, food, wood, or the like.

Both source power (SP) and bias power (BP) may be supplied as radio frequency (RF) power to the processing chamber of a plasma processing apparatus. Pulsed plasma processing methods supply one or both of the RF source power and RF bias power to a processing chamber as pulses rather than as continuous wave power. For example, in some embodiments BP pulses may be provided synchronously or asynchronously with SP pulses. In other embodiments, BP pulses are provided with continuous wave SP.

According to one or more embodiments of the present disclosure, this application relates to methods, apparatuses, and systems for ion energy distribution control. Precise control of ion energy distribution (IED) functions for etching processes is advantageous for semiconductor processing, such as for advanced 3 nm node processing including gate and high aspect ratio contact (HARC) processes. A bias waveform may be achieved by the synchronizing and superposing of pulsed direct current (DC) bias and radio frequency (RF) bias at a same frequency. The resulting waveform can precisely control ion energy, thereby enabling the narrowing of ion energy distributions for plasma processes.

The bias waveform may generate ions with a narrow ion energy spread that may not be achievable by existing RF bias methods. The bias waveform may reduce the charging effect generated by DC bias or pulsed DC bias, which may allow for narrowing of the ion energy spread to obtain monoenergetic ions. The bias waveform may enable precision control of ion energy with a narrow ion energy spread and control of ion flux for ions with different energies. The bias waveform may be implemented in various plasma processing technologies, such as plasma chambers using capacitively coupled plasma (CCP), multi-frequency CCP, inductively coupled plasma (ICP), microwave plasma (MW), electron cyclotron resonance (ECR), or other suitable systems. Amplitude and phase of the RF bias and pulsed DC bias may be used to control the ion energy. Ion flux of ions with different energies can be controlled by a pulsed DC duty cycle.

Embodiments of the disclosure are described in the context of the accompanying drawings. An embodiment of an example plasma processing system will be described using FIG. 1. An example of a sinusoidal wave bias waveform will be described using FIG. 2. An example of an ion energy distribution (IED) will be described using FIG. 3. Embodiments of bias waveform voltages will be described using FIGS. 4 and 5. Embodiments of a method for ion energy distribution control will be described using FIGS. 6A, 6B, and 6C. Embodiments of a method for precise ion energy control will be described using FIGS. 7A and 7B. Embodiments of a method for precise ion energy spread control will be described using FIGS. 8A and 8B. Embodiments of methods for precise ion energy flux control will be described using FIGS. 9A, 9B, 9C, and 9D. Examples of bias voltage waveforms will be illustrated using FIGS. 10A, 10B, and 10C. Simulation results for a bias voltage waveform will be described using FIGS. 11A and 11B. Embodiments of a system for forming a tailored hybrid bias waveforms will be described using FIGS. 12A-12E. Embodiments of objective functions for tuning ion energy distributions will be described using FIGS. 13 and 14A-14B. Embodiments of a feedback control algorithm will be described using FIG. 15. Embodiments of a real time control loop will be described using FIG. 16. An embodiment of a method for generating a bias voltage will be described using FIG. 17. Embodiments of methods for plasma processing will be described using FIGS. 18, 19, and 20.

FIG. 1 illustrates an example plasma processing system 10, in accordance with some embodiments. As illustrated in FIG. 1, the plasma processing system 10 comprises a plasma processing chamber 110 with source power excitation and substrate bias power (in other words, wafer biasing capabilities). The plasma processing chamber 110 comprises a top plate 112, a bottom plate 114, and a side wall 116. The top plate 112, bottom plate 114, and side wall 116 may be nonconductive, conductive or electrically connected to the system ground (a reference potential).

Further in FIG. 1, a top electrode 150 is located outside the plasma processing chamber 110, positioned above the top plate 112. In various embodiments, the top electrode 150 is a conductive spiral coil electrode. However, any suitable top electrode 150 may be used. The top electrode 150 may be coupled to a radio frequency (RF) source 165 via a matching network 167.

The matching network 167 typically includes one or more capacitors and inductors. In embodiments, the capacitors and inductors may be variable. The forward and reflected power at the matching network 167 can be measured, and the matching network 167 may be adjusted to improve impedance matching. For example, a feedback loop circuit may be used to adjust the variable capacitors and inductors.

A substrate 100 may be placed on a substrate holder 105 in the plasma processing chamber 110. In various embodiments, the substrate 100 may be a part of, or including, a semiconductor device, and may have undergone a number of steps of processing following, for example, a conventional process. The substrate 100 accordingly may comprise layers of semiconductors useful in various microelectronics. For example, the semiconductor structure may comprise the substrate 100 in which various device regions are formed.

In one or more embodiments, the substrate 100 may be a silicon wafer or a silicon-on-insulator (SOI) wafer. In certain embodiments, the substrate 100 may comprise a silicon germanium wafer, silicon carbide wafer, gallium arsenide wafer, gallium nitride wafer or other compound semiconductor. In other embodiments, the substrate 100 comprises heterogeneous layers such as silicon germanium on silicon, gallium nitride on silicon, silicon carbon on silicon, or layers of silicon on a silicon or SOI substrate. In various embodiments, the substrate 100 is patterned or embedded in other components of the semiconductor device.

In various embodiments, the plasma processing system 10 may further comprise a focus ring 154 positioned over a bottom electrode 120 to surround the substrate 100. The focus ring 154 may advantageously maintain and extend the uniformity of a plasma 160 to achieve process consistency at the edge of the substrate 100. In various embodiments, the focus ring 154 may have a width of a few centimeters. In various embodiments, there may be a gap for mechanical clearance between the circumference of the substrate 100 and the focus ring 154. In certain embodiments, the gap may be hundreds of microns to a few millimeters. In various embodiments, the focus ring 154 comprises a dielectric material with a desired dielectric constant. In certain embodiments, the focus ring 154 comprises silicon. Some examples of silicon-based focus rings comprise silicon, silicon oxide, doped silicon (e.g., boron-doped, nitrogen-doped, and phosphorous-doped), or silicon carbide. Alternatively, in some embodiments, the focus ring comprises a carbon-based material. In one or more embodiments, the focus ring 154 may comprise a metal oxide, such as aluminum oxide or zirconium oxide.

A process gas is introduced into the plasma processing chamber 110 by a gas delivery system 115. The gas delivery system 115 may comprise multiple gas flow controllers to control the flow of multiple gases into the plasma processing chamber 110. Any precursors that can create a plasma may be used, such as argon (Ar), tetrafluoromethane ($CF_4$), oxygen ($O_2$), an admixture of tetrafluoromethane and oxygen ($CF_4/O_2$), hexafluorobutadiene ($C_4F_6$), octafluorocyclobutane ($C_4F_8$), nitrogen ($N_2$), hydrogen ($H_2$), hydrogen bromide (HBr), the like, or any combination, or admixture thereof in any suitable ratio. In some embodiments, optional center/edge splitters may be used to independently adjust the gas flow rates at the center and edge of the substrate 100. In various embodiments, the total flow rate of the gas is in a range of 1 standard cubic centimeter per minute (sccm) to 5000 sccm, at a pressure in a range of 0.1 mTorr to 1 Torr, and/or at a temperature in a range of −200° C. to 500° C.

Further, in one embodiment, the gas delivery system 115 has a special showerhead configuration positioned at the top of the plasma processing chamber 110. For example, the gas delivery system 115 may have a showerhead configuration, covering the entirety of the substrate 100, including a plurality of appropriately spaced gas inlets. Alternatively, gas may be introduced through dedicated gas inlets of any other suitable configuration. The plasma processing chamber 110 may further be equipped with one or more sensors such as pressure monitors, gas flow monitors, and/or gas species density monitors. The sensors may be integrated as a part of the gas delivery system 115 in various embodiments.

In FIG. 1, the plasma processing chamber 110 is a vacuum chamber and may be evacuated using one or more vacuum pumps 135, such as a single stage pumping system or a multistage pumping system (e.g., a mechanical roughing pump combined with one or more turbomolecular pumps). In order to promote even gas flow during plasma processing, gas may be removed from more than one gas outlet or location in the plasma processing chamber 110 (e.g., on opposite sides of the substrate 100).

In various embodiments, the substrate holder 105 may be integrated with, or a part of, a chuck (e.g., a circular electrostatic chuck (ESC)) positioned near the bottom of the plasma processing chamber 110, and connected to the bottom electrode 120. The surface of the chuck or the substrate holder 105 may be coated with a conductive material (e.g., a carbon-based or metal-nitride based coating). The substrate 100 may be optionally maintained at a desired temperature using a temperature sensor and a heating element connected to a temperature controller (not shown). In certain embodiments, the temperature sensor may comprise a thermocouple, a resistance temperature detector (RTD), a thermistor, or a semiconductor based integrated circuit. The heating element may for example comprise a resistive heater in one embodiment. In addition, there may be a cooling element such as a liquid cooling system coupled to the temperature controller.

The bottom electrode 120 may be coupled to an RF bias power source 130, such as through a matching circuit 132, and to a DC power source 190. The matching circuit 132 may comprise similar components in similar configurations as described above for the matching network 167, and the details are not repeated herein. The RF bias power source 130 provides a sinusoidal wave bias waveform and the DC power source 190 provides a pulsed DC square wave (see below, FIGS. 4 and 5) to the bottom electrode 120. The combination of the sinusoidal waveform and the pulsed DC square wave provide a bias waveform to the bottom electrode 120 that may allow for precise control of ion energy.

A voltage sensor 140 (also referred to as a VI sensor or wafer VI sensor) is coupled to the substrate holder or is otherwise present inside the plasma processing chamber 110. The voltage sensor 140 may be used to measure in real time quantities such as $V_{wf}(t)$ (the voltage at the substrate 100 as a function of time), $I_{wf}(t)$ (the current at the substrate 100 as a function of time), $\phi_{wf}(t)$ (the phase angle between the voltage and the current at the substrate 100 as a function of time), and $V_p(t)$ (the plasma potential as a function of time, which may be determined from the DC voltage $V_{DC}(t)$ measured at the substrate 100). These quantities may be used to determine by how much to adjust the output of the RF bias power source 130 and the DC power source 190 in order to provide a desired bias waveform, as described below with respect to FIGS. 12A-12E, 13, 14A-14B, 15, and 16.

In various embodiments, a capacitive probe 142 is present in the plasma processing chamber 110. The capacitive probe 142 may be used to measure the plasma potential $V_p(t)$ of the plasma 160 in real time. Although the capacitive probe 142 is illustrated as extending through the bottom plate 114 adjacent to the substrate holder 105, the capacitive probe 142 may have any suitable location.

In various embodiments, an optical emission spectroscopy (OES) sensor 144 is present in the plasma processing chamber 110, for OES. The OES sensor 144 may be used to measure the properties of the plasma 160 in real time. Although the OES sensor 144 is illustrated as being mounted on a side wall 116 of the plasma processing chamber 110, the OES sensor 144 may have any suitable location.

The plasma processing system 10 further comprises a controller 170 to control plasma processing and adjust parameters in real time. In some embodiments, the controller 170 is a programmable processor, microprocessor, computer, or the like. Although the controller 170 is illustrated as a single element for illustrative purposes, the controller 170 may include additional elements or be part of a single element. The controller 170 may be programmable by instructions stored in software, firmware, hardware, or a combination thereof. The controller 170 may be coupled to the RF source 165, the matching network 167, the RF bias power source 130, the matching circuit 132, the gas delivery system 115, the one or more vacuum pump(s) 135, the voltage sensor 140, the capacitive probe 142, and/or the OES sensor 144. The controller 170 may be configured to set, monitor, and/or control various control parameters associated with generating a plasma and delivering ions to the surface of a microelectronic workpiece (e.g., a substrate 100 such as a semiconductor wafer). Control parameters may include, but are not limited to, power level, frequency, and duty cycle (%) for the source power, the bias power, and the DC voltage, as well as phase delay between the bias RF voltage and DC voltage. Other control parameter sets may also be used.

The RF source 165 may be used to supply pulsed RF power or continuous wave (CW) power to sustain the plasma. In some embodiments where the plasma is generated and sustained by pulsed RF power, the operating pulse frequency range for the RF source power is 1 Hz to 100 MHz. Pulsed RF power from one or more RF power source(s) may be supplied in phase, out of phase, or with overlapping phases. While only one RF power source (in other words, the RF source 165) is illustrated in FIG. 1, more than one RF power source(s) may be used in various embodiments, for example, to provide a low frequency RF power and a high frequency RF power at the same time. In various embodiments, an RF pulsing in a kHz range may be used to power the plasma 160.

In some embodiments, the operating frequency range for the RF bias power is 10 kHz to 10 GHz, such as 50 kHz to 100 MHz. While only one bias RF power source 130 is illustrated in FIG. 1, more than one bias RF power source(s) 130 may be used in various embodiments, for example, to provide a low frequency bias RF power and a high frequency bias RF power at the same time and enable changing the bias RF frequency more rapidly.

The configurations of the plasma processing system described above are for example only. In alternative embodiments, various alternative configurations may be used for a plasma processing system that incorporates a set of electromagnets. Further, microwave plasma (MW), electron cyclotron resonance (ECR), capacitively coupled plasma (CCP), multi-frequency CCP, inductively coupled plasma (ICP), or other suitable systems may be used. In various embodiments, the RF power, chamber pressure, substrate temperature, gas flow rates and other plasma process parameters may be selected in accordance with the respective process recipe.

In addition, embodiments of the present invention may be also applied to remote plasma systems as well as batch systems. For example, the substrate holder may be able to support a plurality of wafers that are spun around a central axis as they pass through different plasma zones. Accordingly, it is possible to have multiple plasma zones, for example, including a metal-containing plasma zone, metal-free plasma zone, and plasma-free zone (e.g., a purge zone).

FIGS. 2-5, 6A-6C, 7A-7B, 8A-8B, and 9A-9D illustrate various graphs of bias waveforms achieved by the synchronizing and superposing of pulsed direct current (DC) bias and radio frequency (RF) bias and resulting ion energy distribution functions, in accordance with some embodiments. A bias waveform for precise control of ion energy with a narrow ion energy spread and control of ion flux for ions with different energies may be achieved by the synchronizing and superposing of pulsed direct current (DC) bias and radio frequency (RF) bias at a same frequency. This may enable the narrowing of ion energy distributions for plasma processes and may reduce the charging effect generated by applying DC bias or pulsed DC bias only. Reducing the charging effect may allow for narrowing of the ion energy spread to obtain monoenergetic ions. Ion energy may be controlled using amplitude and phase of the RF bias and pulsed DC bias. A pulsed DC duty cycle may control ion flux of ions with different energies.

Figure 2:
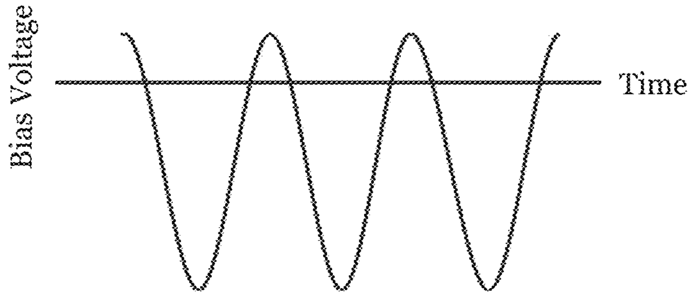
FIG. 2 illustrates a graph of an example sinusoidal wave bias waveform.
Figure 3:
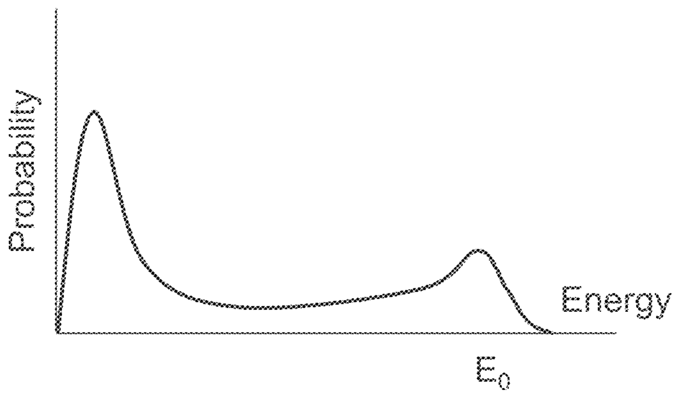
FIG. 3 illustrates an example ion energy distribution.

FIG. 2 illustrates a graph of an example sinusoidal wave bias waveform and FIG. 3 illustrates an example ion energy distribution. The voltage oscillation of the sinusoidal wave bias waveform illustrated by FIG. 2 may result in the broad bimodal ion energy distribution illustrated by FIG. 3 with a lower peak close to zero energy and a higher peak at an energy $E_0$. Ions of a plasma 160 (see above, FIG. 1) may arrive at a substrate 100 (see above, FIG. 1) with an energy dependent on the sheath voltage of the plasma 160 (in other words, on the accelerating voltage applied by the bias power). A time-varying RF power supplied to the plasma 160 may produce a time-varying sheath voltage, which may result in ions arriving at the substrate 100 with a range of energies that are determined by the RF frequency and RF voltage and power supplied to the plasma 160. Although mixing RF frequencies supplied to the plasma 160 may modify the aggregated ion energy distribution, independent control of the ion energy distribution may be limited. As a result, a charging effect may occur on dielectric surfaces (e.g., dielectric portions part of or on a substrate 100), resulting in the broad bimodal ion energy distribution illustrated by FIG. 3.

Figure 4:
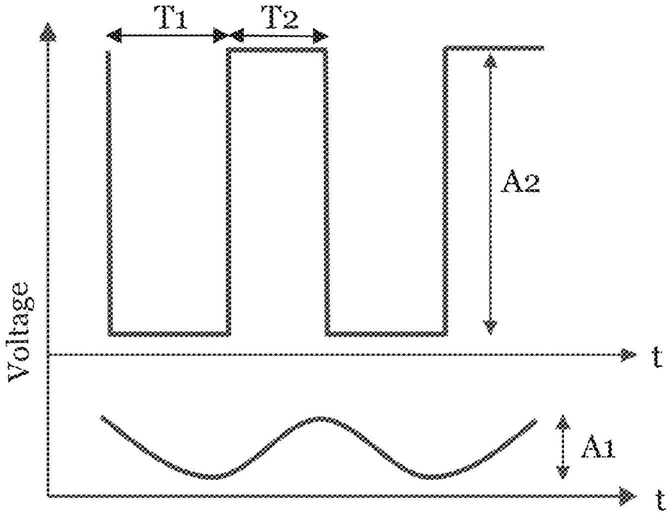
FIG. 4 illustrates graphs of two separate bias waveform voltages, in accordance with some embodiments.
Figure 5:
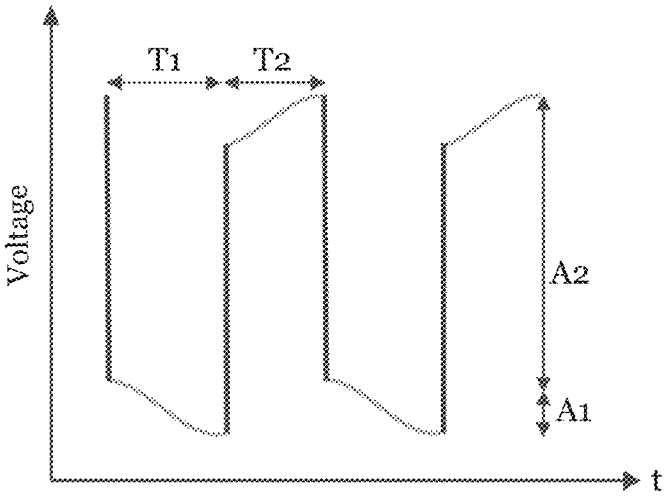
FIG. 5 illustrates a graph of a bias waveform voltage by combining waveforms in FIG. 4, in accordance with some embodiments.

FIGS. 4 and 5 illustrate graphs of a bias waveform voltage that is a combination of a pulsed DC square wave and a complementary RF sinusoidal wave that may provide direct control over an ion energy distribution, in accordance with some embodiments. FIG. 4 illustrates an RF sinusoidal wave with an amplitude A1 and a pulsed DC square wave (alternating between DC being on for a period T1 and off for a period T2) with an amplitude A2. In FIG. 5, the RF sinusoidal wave and the pulsed DC square wave from FIG. 4 form a combined bias waveform with a total amplitude of A1+A2. The bias waveform voltage may be provided to, for example, a bottom electrode 120 of a plasma processing chamber 110 (see above, FIG. 1). In some embodiments, as illustrated by FIG. 5, the bias waveform comprises sinusoidal horizontal segments between vertical segments.

The bias waveform voltage of FIG. 5 is tunable by adjusting tunable parameters such as frequency, duty cycle, DC voltage, and RF amplitude (corresponding to RF power), which may provide direct control over the ion energy distribution. In some embodiments, the frequency of the RF sinusoidal wave and the frequency of the pulsed DC square wave are the same, and the frequencies may be adjusted together. In various embodiments, the shared frequency of the RF sinusoidal wave and the pulsed DC square wave is in a range of 50 kHz to 100 MHz, such as 200 kHz or 400 kHz.

The RF sinusoidal wave and the pulsed DC square wave may be synchronized at a same phase or at different respective phases. The duty cycle of the pulsed DC square wave (in other words, the on time and off time of the DC) is tunable to adjust the ion energy distribution. The DC voltage of the pulsed DC square wave may be adjusted to determine the main ion energy peak. The RF amplitude may be adjusted to determine the ion energy spread.

Figure 6A:
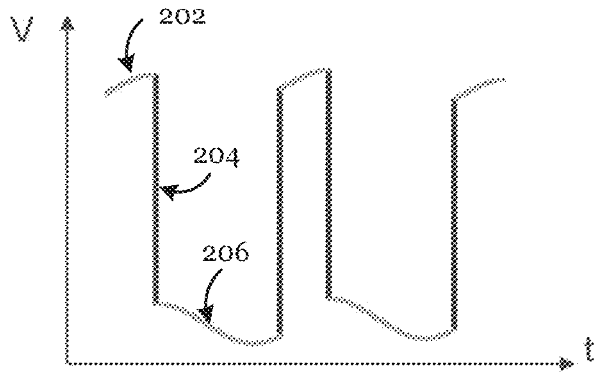
FIGS. 6A, 6B, and 6C illustrate graphs of bias waveform, substrate voltage, and ion energy distribution, in accordance with some embodiments.
Figure 6B:
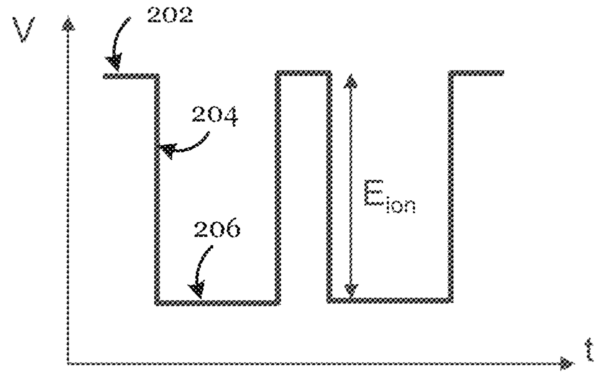
Figure 6C:
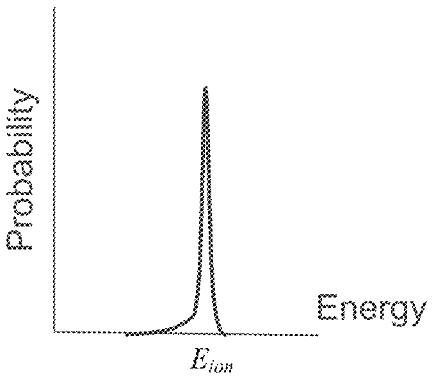

FIGS. 6A, 6B, and 6C illustrate graphs of bias waveform, substrate voltage, and ion energy distribution for a method of ion energy distribution control, in accordance with some embodiments. Surface charges accumulated during a charge phase of the waveform illustrated by FIG. 6A at step 206 on a substrate 100 (e.g., a wafer; see above, FIG. 1) are periodically neutralized during a discharge phase of the waveform illustrated by FIG. 6A at step 202, which attracts electrons to a top surface of the substrate 100. It is desirable to maintain the substrate surface voltage (see below with reference to FIG. 6B at step 206) at a constant or close to constant level during the charging phase of the waveform (see below, step 206), which may be achieved by using controlled RF amplitude and phases of the pulsed DC square wave and RF sinusoidal wave.

FIG. 6A illustrates a graph of bias waveform voltage versus time during a method of ion energy distribution control. Wafer surface charge (e.g., surface charge on a substrate 100; see above, FIG. 1) is periodically neutralized during discharge phase of waveform (illustrated by FIG. 6A at step 202), which attracts electrons to discharge the surface charge on the wafer. At step 202, as the waveform voltage rises, electrons are attracted to the surface of the substrate 100 to discharge the surface charge. At step 204, the pulsed DC voltage is turned on and modulated to set a desired ion energy. At step 206, the waveform voltage falls in order to compensate for the ion current to the surface of the substrate 100 and thereby keep the voltage (illustrated by FIG. 6B at step 206) of the substrate 100 close to or at a constant voltage.

FIG. 6B illustrates a graph of substrate voltage versus time corresponding to the graph of bias waveform voltage illustrated in FIG. 6A. At step 202, the voltage of the substrate 100 is close to zero while the pulsed DC voltage is off. At step 204, the pulsed DC voltage is turned on and modulated to set a desired peak ion energy $E_{ion}$ for the ion energy distribution of the plasma 160 (see above, FIG. 1). At step 206, it is desirable to keep the voltage of the substrate 100 close to or at a constant voltage (illustrated by FIG. 6B at step 206), such as within a range of 50 V to 15 kV, or 50 V to 10 kV. This may be achieved by the falling slope of the bias waveform voltage (illustrated by FIG. 6A at step 206).

FIG. 6C illustrates a graph of ion energy distribution corresponding to the graph of bias waveform voltage and the graph of substrate voltage versus time illustrated in FIGS. 6A and 6B, respectively. The ion energy distribution is narrow with a single peak at the desired ion energy $E_{ion}$. This may be advantageous over the broad bimodal ion energy distribution illustrated by FIG. 3 with a lower peak close to zero energy and a higher peak at an energy $E_0$ as the narrow ion energy distribution with a single peak may allow for more precise processes (e.g., advanced 3 nm node processing including gate and high aspect ratio contact (HARC) processes). Although FIG. 6C illustrates a single peak in the ion energy distribution at the desired ion energy $E_{ion}$, and no peak close to zero energy, in some embodiments a peak may occur at or close to zero energy with ions at intermediate energies between the desired ion energy $E_{ion}$ and zero energy being suppressed.

FIGS. 7A, 7B, 8A, 8B, 9A, 9B, 9C, and 9D illustrate how the combined bias waveform provides independent controls for DC voltage and RF power. This allows for tuning of ion energy distributions to desired ion energy peaks, ion energy spreads, and ion fluxes.

Figure 7A:
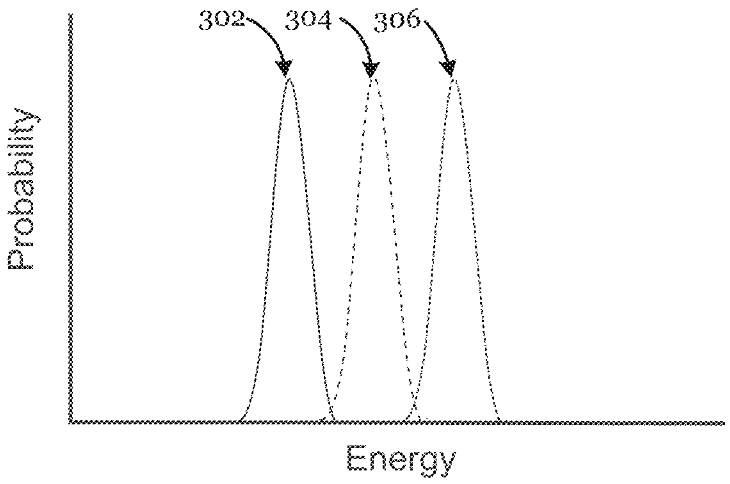
FIGS. 7A and 7B illustrate methods of precise ion energy control, in accordance with some embodiments.
Figure 7B:
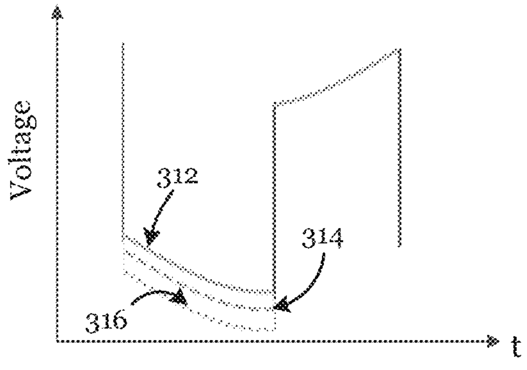

FIGS. 7A and 7B illustrate methods of precise ion energy control by adjusting DC voltage amplitude, in accordance with some embodiments. As illustrated by FIGS. 7A and 7B, together with the RF voltage, the amplitude of the DC voltage can be used to determine the ion energy (in other words, the location of the peak energy of the ion energy distribution), with lower DC voltage producing ion energy distributions with a peak at higher energies. FIG. 7A illustrates an ion energy distribution (IED) 302 that peaks at a lower energy, an IED 304 that peaks at an intermediate energy, and an IED 306 that peaks at a higher energy. FIG. 7B illustrates a bias waveform 312 with higher DC voltage corresponding to the IED 302 with lower energy, a bias waveform 314 with intermediate DC voltage corresponding to the IED 304 with intermediate energy, and a bias waveform 316 with lower DC voltage corresponding to the IED 306 with higher energy.

Figure 8A:
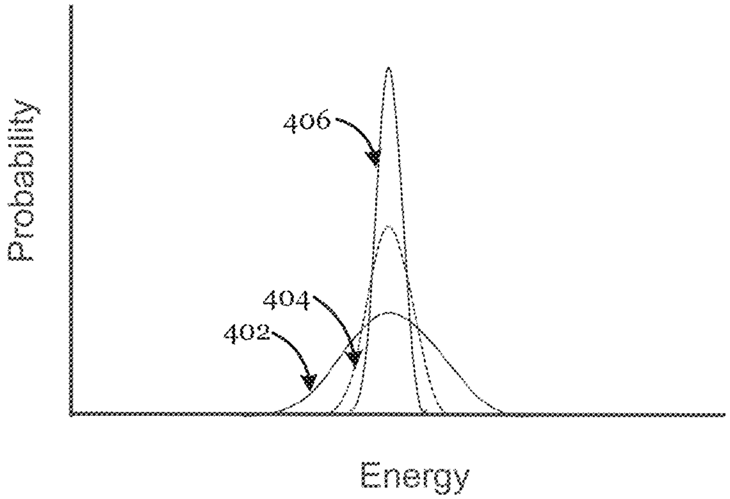
FIGS. 8A and 8B illustrate methods of precise ion energy spread control, in accordance with some embodiments.
Figure 8B:
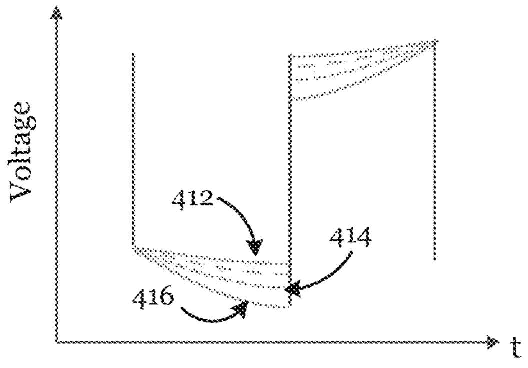

FIGS. 8A and 8B illustrate methods of precise ion energy spread or width control using RF power or amplitude, in accordance with some embodiments. As illustrated by FIGS. 8A and 8B, adjusting the RF power or amplitude can be used to determine the ion energy spread (in other words, the width of the energy peak of the ion energy distribution), with lower RF power or amplitude producing ion energy distributions with larger widths and higher RF power or amplitude producing ion energy distributions with smaller widths. FIG. 8A illustrates an ion energy distribution (IED) 402 with a wider spread in energy, an IED 404 with an intermediate spread in energy, and an IED 406 with a narrow spread in energy. FIG. 8B illustrates a bias waveform 412 with lower RF power or amplitude corresponding to the IED 402 with wider spread in energy, a bias waveform 414 with intermediate RF power or amplitude corresponding to the IED 404 with intermediate spread in energy, and a bias waveform 416 with higher RF power or amplitude corresponding to the IED 406 with narrower spread in energy. RF power and amplitude may be adjusted based on the charging of the wafer surface. With greater surface charging, it is desirable to use a larger RF power or amplitude.

Figure 9A:
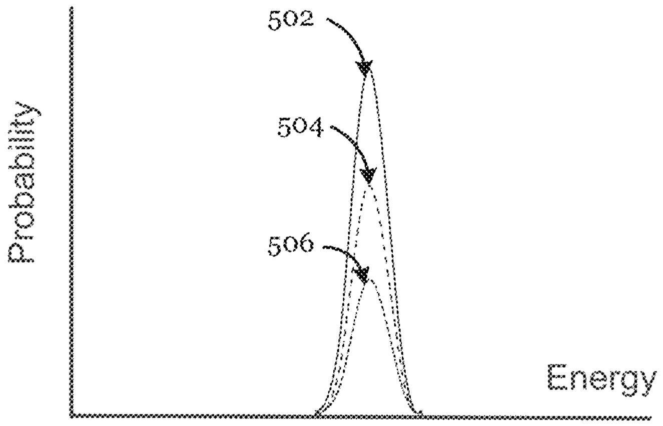
FIGS. 9A, 9B, 9C, and 9D illustrate methods of precise ion flux control, in accordance with some embodiments.
Figure 9B:
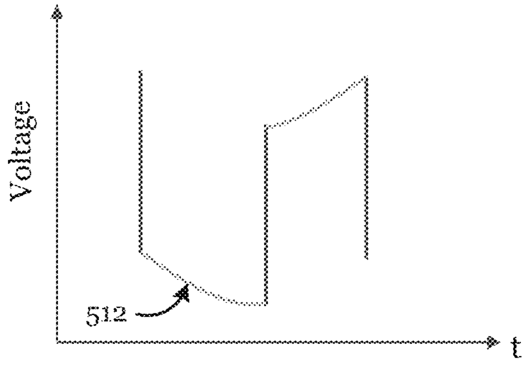
Figure 9C:
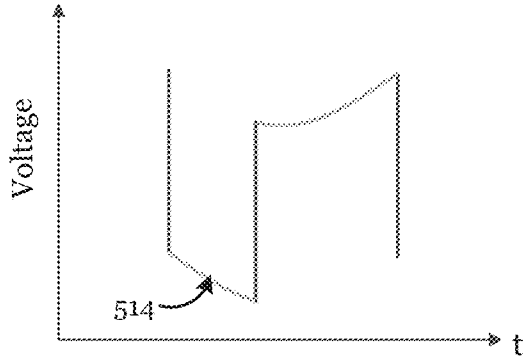
Figure 9D:
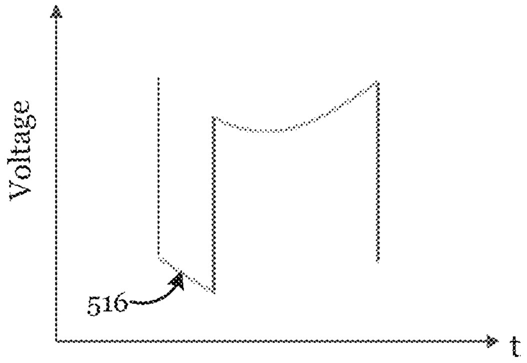

FIGS. 9A, 9B, 9C, and 9D illustrate methods of precise ion flux control using control of RF and pulsed DC duty cycles, in accordance with some embodiments. As illustrated by FIGS. 9A-9D, adjusting the duty cycles of the pulsed DC voltage can be used to determine the ion flux (in other words, the absolute amplitude of the ion energy distribution), with duty cycles having a greater ratio of DC voltage on time to DC voltage off time producing ion energy distributions with higher flux and duty cycles having a smaller ratio of DC voltage on time to DC voltage off time producing ion energy distributions with smaller flux. FIG. 9A illustrates an ion energy distribution (IED) 502 with a greater ion flux (in other words, with a higher amplitude), an IED 504 with an intermediate ion flux (in other words, with an intermediate amplitude), and an IED 506 with a smaller ion flux (in other words, with a lower amplitude). FIG. 9B illustrates a bias waveform 512 with a duty cycle having about equal times of DC voltage on and DC voltage off corresponding to the IED 502 with greater ion flux. FIG. 9C illustrates a bias waveform 514 with a duty cycle having less time of DC voltage on compared to DC voltage off (such as in a ratio of 1:1 to 1:2 of DC voltage on to DC voltage off) corresponding to the IED 504 with intermediate ion flux. FIG. 9D illustrates a bias waveform 516 with a duty cycle having still less time of DC voltage on compared to DC voltage off (such as in a ratio of less than 1:2 of DC voltage on to DC voltage off) corresponding to the IED 506 with smaller ion flux.

Figure 10A:
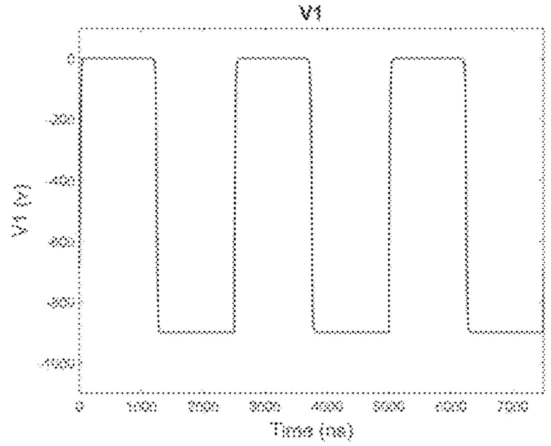
FIGS. 10A, 10B, and 10C illustrate graphs of examples of bias voltage waveforms, in accordance with some embodiments.
Figure 10B:
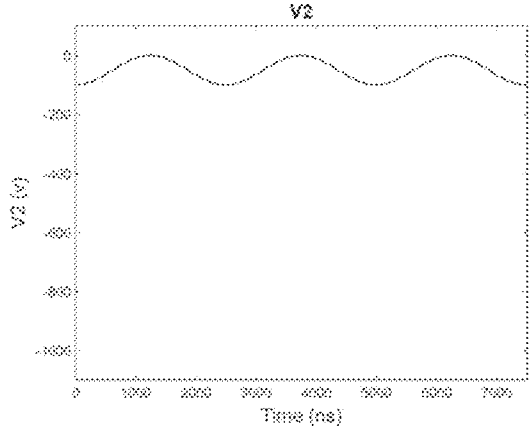
Figure 10C:
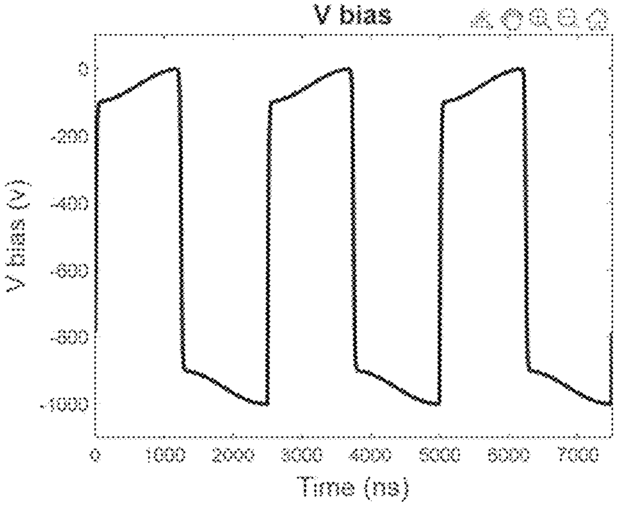

FIGS. 10A, 10B, and 10C illustrate graphs of examples of bias voltage waveforms plotted as voltage versus time, in accordance with some embodiments. FIG. 10A illustrates a pulsed DC square wave bias between 0 V and about 900 V and a frequency of about 400 kHz. FIG. 10B illustrates an RF power sinusoidal wave bias between 0V and about −100

V and a frequency of about 400 kHz. FIG. 10C illustrates a bias waveform that is the combination of the pulsed DC square wave bias of FIG. 10A and the RF power sinusoidal wave bias of FIG. 10B.

Figure 11A:
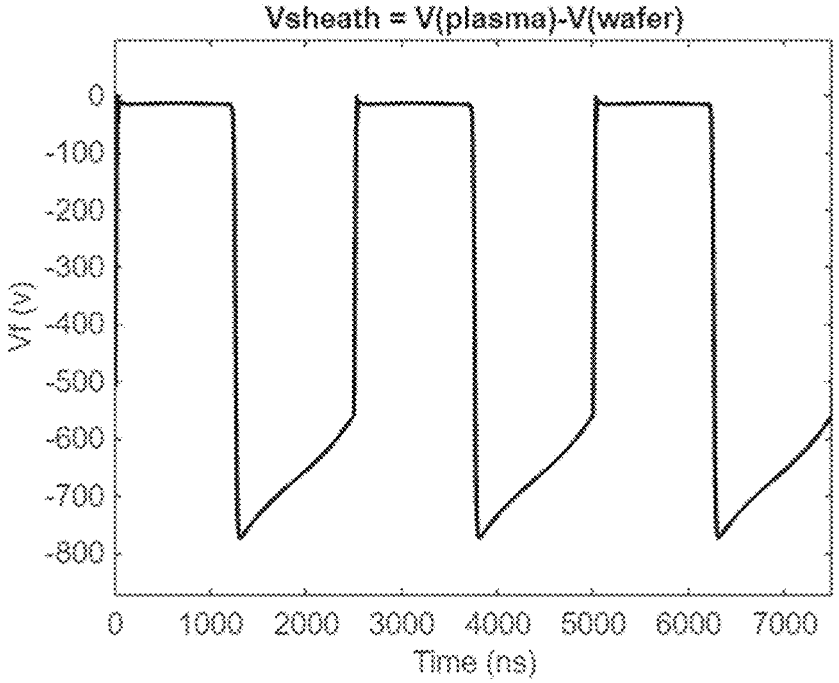
FIGS. 11A and 11B illustrate graphs of simulation results of sheath voltage and ion energy distribution (IED) for a bias waveform such as illustrated in FIG. 10C, in accordance with some embodiments.
Figure 11B:
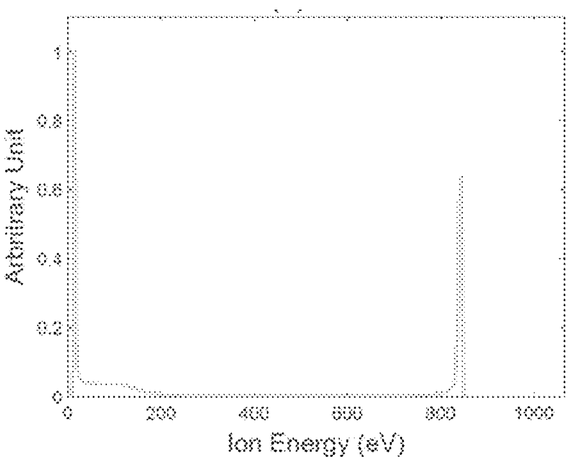

FIGS. 11A and 11B illustrate graphs of simulation results for the bias waveform voltage illustrated above in FIG. 10C, in accordance with some embodiments. The simulation results were produced with a wafer (e.g., a substrate 100; see above, FIG. 1) in a plasma processing chamber (e.g., a plasma processing chamber 110; see above, FIG. 1) using simulation parameters of an electron density of about $1\times10^{16}$ electrons per $m^3$, an electron temperature of about 3 eV, and a wafer capacitance of about 1000 pF. FIG. 11A illustrates a graph of sheath voltage of a plasma (e.g., a plasma 160; see above, FIG. 1) generated using the bias waveform of FIG. 10C. FIG. 11B illustrates a graph of an ion energy distribution produced by the bias waveform of FIG. 10C and the sheath voltage of FIG. 11A. As shown by FIG. 11B, the ion energy distribution has a peak at an ion energy of about 800 eV to 850 eV and a peak as the ion energy approaches 0 eV, but no intermediate ion energy peak is present between the high and low peaks.

FIGS. 12A-12E, 13, 14A-14B, 15, and 16 illustrate methods and systems for generating a target ion energy, such as during a real-time etching process, in accordance with some embodiments. Disclosed control systems and algorithms may compensate electric potential variation on substrates 100 (e.g., wafers; see above, FIG. 1) by adjusting the RF and/or pulsed DC waveform amplitudes and phase difference in real-time according to outputs of a controller 170. This may be useful for synchronizing ion transit in sheath with an applied bias waveform in real-time. The disclosed systems and algorithms comprise tailored hybrid waveforms for bias power generation (e.g., a bias waveform as described above with respect to FIGS. 4 and 5, or in the following FIG. 12D), objective functions (i.e., control variables) for ion energy distribution tuning, time resolved sensor data for control inputs, and feedback control algorithms and real time control loops.

Figure 12A:
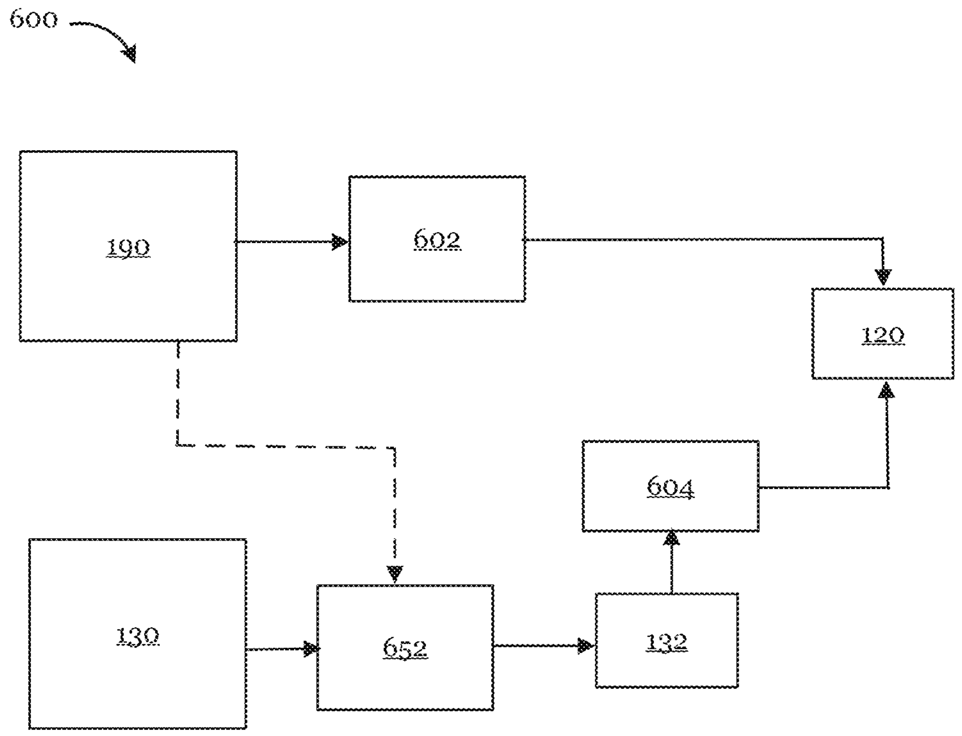
FIG. 12A illustrates a system for forming a tailored hybrid bias waveform, in accordance with some embodiments.
Figure 12B:
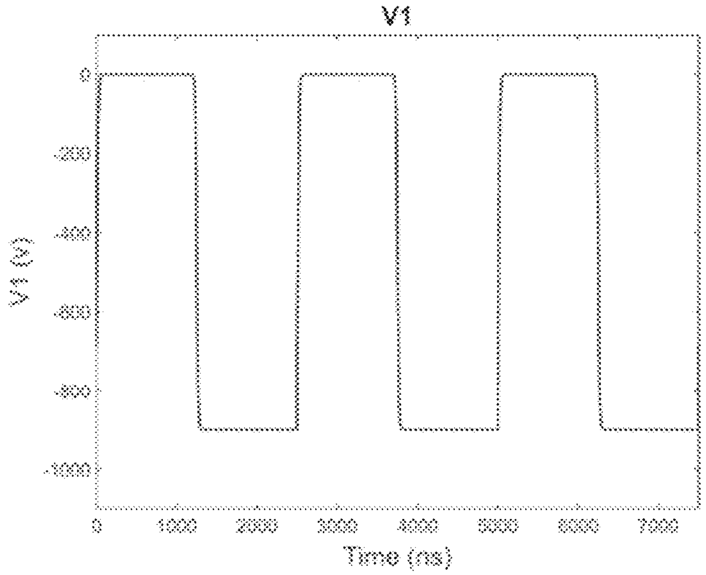
FIGS. 12B-12E illustrate graphs of bias waveforms, in accordance with some embodiments.
Figure 12C:
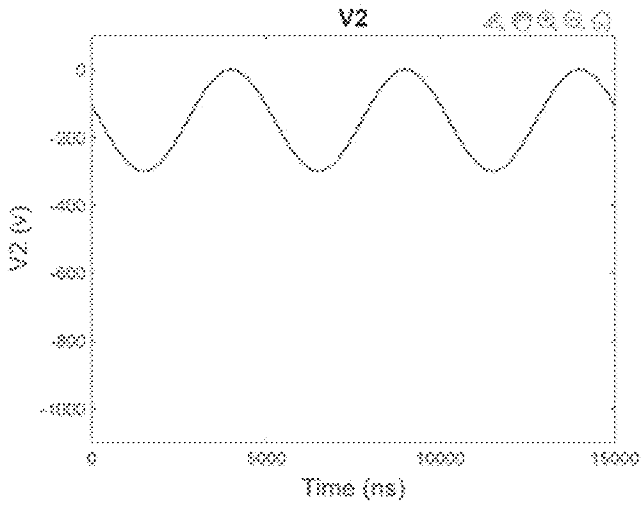
Figure 12D:
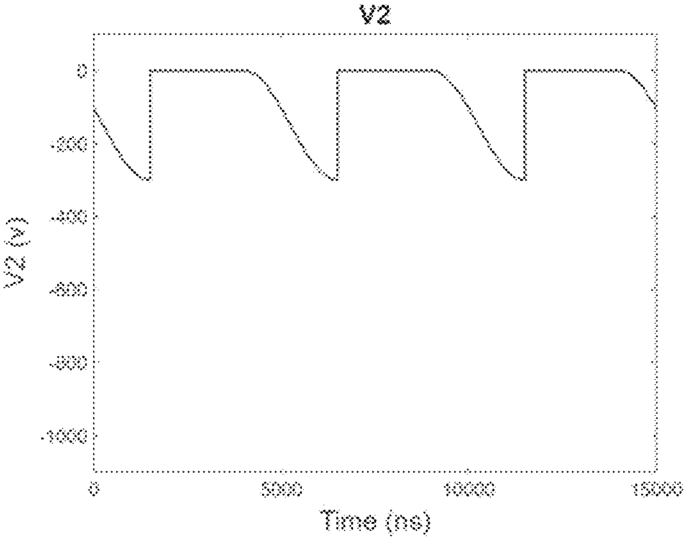
Figure 12E:
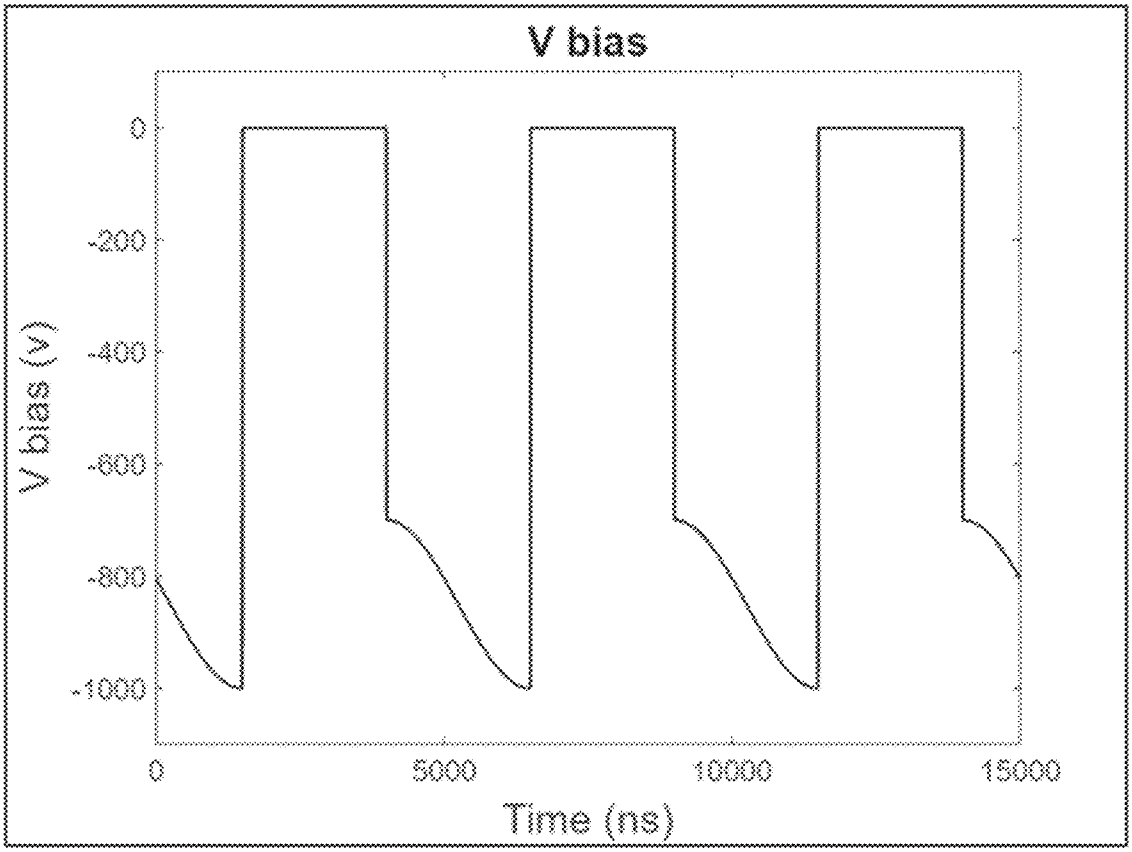

FIG. 12A illustrates a system 600 for forming a tailored hybrid bias waveform, in accordance with some embodiments. The system 600 may be part of a plasma processing system 10, as described above with respect to FIG. 1. A DC power source 190 (also referred to as a DC voltage power supply) produces a pulsed DC square wave, such as the example waveform illustrated by FIG. 12B. In some embodiments, the frequency of the pulsed DC square wave is in a range of 0.1 MHz to 1 MHz. An RF bias power source 130 (also referred to as an RF power supply) provides a sinusoidal wave (also referred to as a regular RF sinusoidal wave), such as the example waveform illustrated by FIG. 12C. In various embodiments, the sinusoidal wave bias waveform has a same frequency as the frequency of the pulsed DC square wave.

In some embodiments, the RF bias power source 130 is coupled to a matching circuit 132 (see above, FIG. 1) through a waveform conditioning circuit 652, which is further coupled with the DC power source 190. The waveform conditioning circuit 652 conditions the sinusoidal wave bias waveform from the RF bias power source 130 with control signal input from the pulsed DC square wave of the DC power source 190 to produce a conditioned RF sawtooth wave or a conditioned RF sinusoidal wave, such as the example waveform illustrated by FIG. 12D, which is passed to the matching circuit 132.

A combination node (e.g., a node coupled with a bottom electrode 120; see above, FIG. 1) is coupled to the DC power source 190 through a filter circuit 602 and to the RF bias power source 130 through an RF filter circuit 604. The filter circuit 602 is coupled between the combination node and the DC power source 190. The RF filter circuit 604 is coupled to the RF bias power source 130 through the matching circuit 132 and the waveform conditioning circuit 652 (if present). The combination node receives the filtered pulsed DC square wave and the filtered RF sawtooth wave, which together add up to a tailored hybrid bias waveform (also referred to as a bias waveform or bias waveform voltage; see above, FIGS. 4 and 5), such as the example waveform illustrated by FIG. 12E. The tailored hybrid bias waveform is designed to balance surface charging on a dielectric substrate (e.g., a wafer) during a charging phase of a plasma process. The tailored hybrid bias waveform may be adjusted or tuned by control knobs such as the frequency of the tailored hybrid bias waveform, the amplitude of the pulsed DC square wave voltage, the amplitude of the RF sinusoidal wave bias waveform, the phase delay between the pulsed DC square wave voltage and the RF sinusoidal wave bias waveform, the duty cycle of the pulsed DC square wave voltage, or the like, as described above with respect to FIGS. 7A, 7B, 8A, 8B, 9A, 9B, 9C, and 9D.

Figure 13:
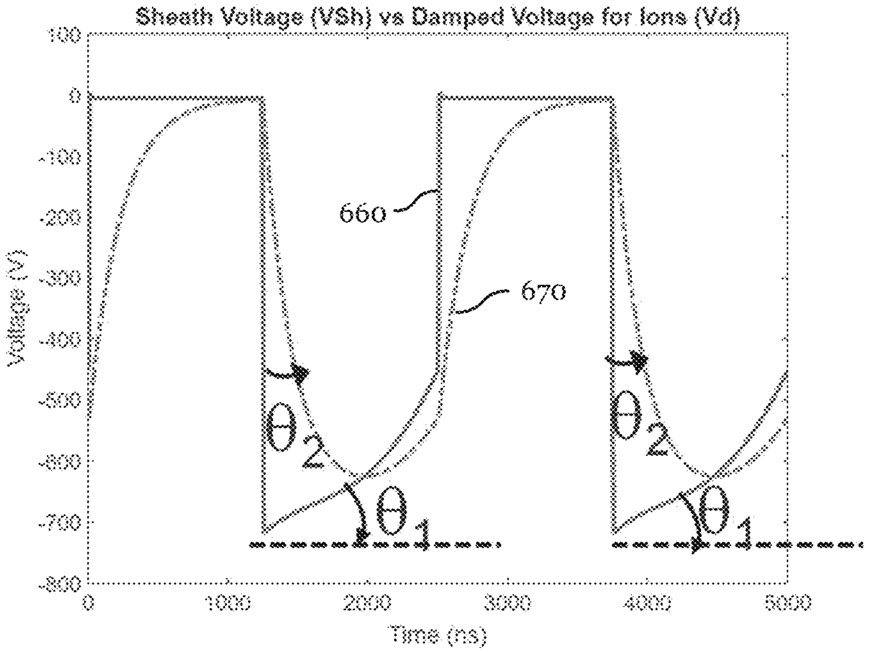
FIG. 13 illustrates example objective functions for tuning ion energy distributions, in accordance with some embodiments.

FIG. 13 illustrates objective functions that are used to tune ion energy distributions, in accordance with some embodiments. In particular, FIG. 13 illustrates a graph of voltage versus time for a sheath voltage 660 (in other words, voltage on a substrate 100, e.g., a wafer) and for a damped voltage for ions 670 (in other words, the actual voltage experienced by ions in a plasma sheath).

Objective functions (also referred to as control variables) $\theta_1$ and $\theta_2$, which may be used to adjust an ion energy distribution function towards a desired shape (e.g., a shape with narrow energy spread), are illustrated in FIG. 13. $\theta_1$ is the angle between the diagonal lower segments of the sheath voltage 660 and a line parallel to the x-axis (in other words, a slope of the sheath voltage), and $\theta_1$ corresponds to surface charging effects on a wafer. $\theta_2$ is the angle between the vertical portion of the sheath voltage 660 and the downward diagonal portion of the damped voltage for ions 670, and $\theta_2$ corresponds to synchronization between ion and applied sheath voltage.

Figure 14A:
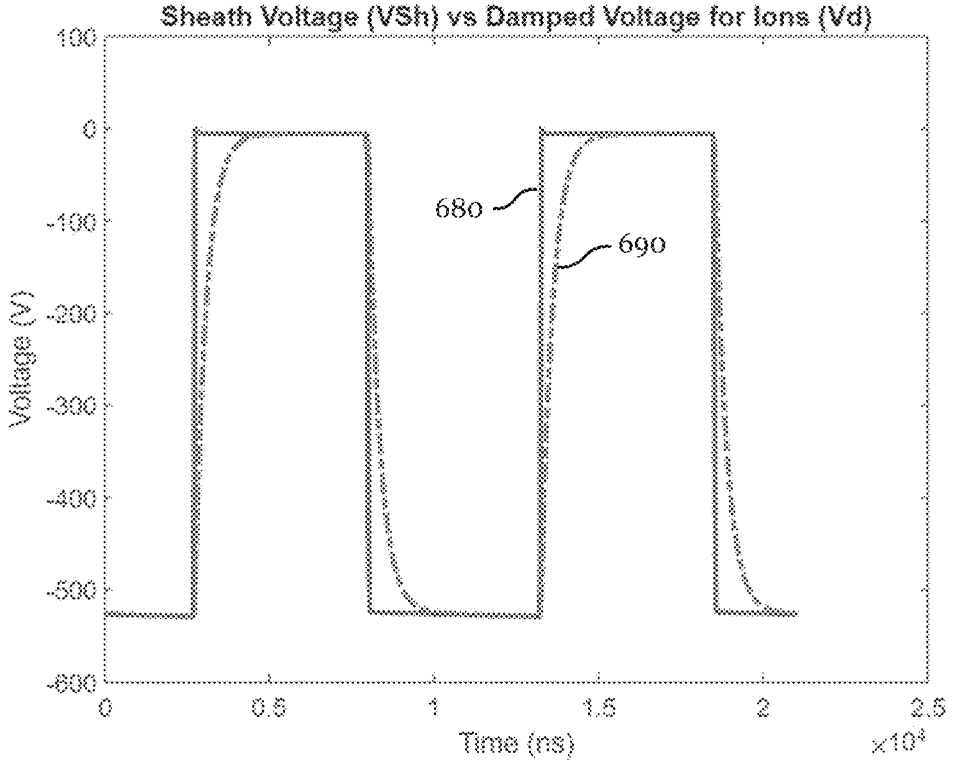
FIG. 14A-14B illustrate graphs of simulation results of sheath voltage, damped voltage for ions and ion energy distribution functions (IEDF) under optimized objective function conditions, in accordance with some embodiments.
Figure 14B:
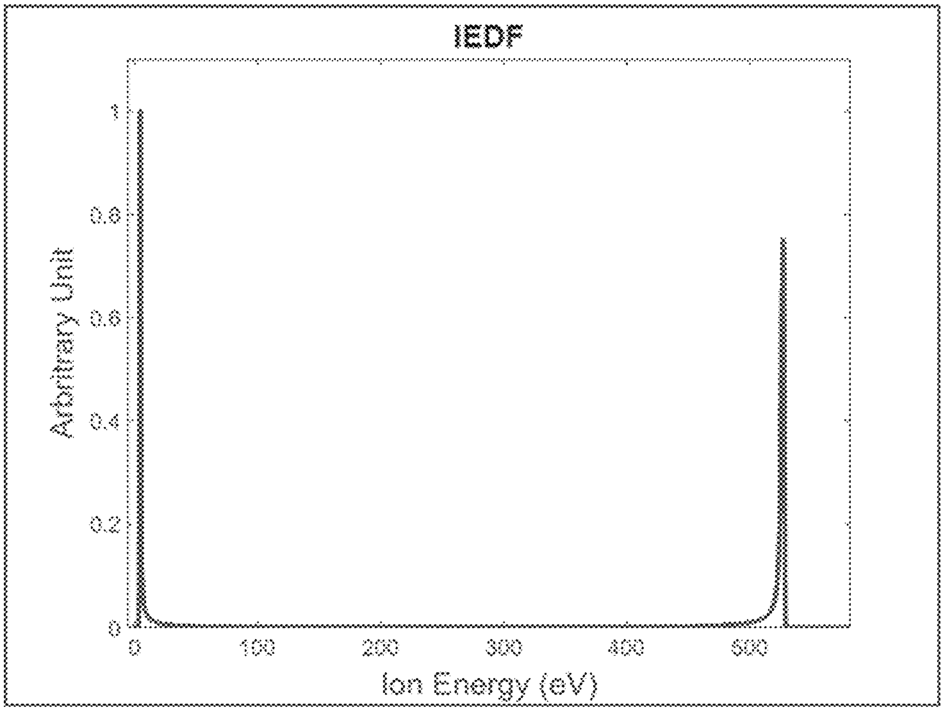

FIG. 14A illustrates a graph of voltage versus time for a sheath voltage 680 and for an ion voltage 690 with minimized $\theta_1$ and $\theta_2$, in accordance with some embodiments. Minimizing $\theta_1$ and $\theta_2$ corresponds to reducing or eliminating the surface charging effect and synchronizing the ion and applied sheath voltages, respectively. FIG. 14B illustrates a calculated ion energy distribution function corresponding to the sheath voltage 680 and ion voltage 690 illustrated by FIG. 14A. As illustrated by FIG. 14B, the ion energy distribution function for optimized $\theta_1$ and $\theta_2$ (such as minimized $\theta_1$ and $\theta_2$) has desirably narrow energy peaks.

In some embodiments, $\theta_1$ is calculated between times t1 and t2 with the formula $$\sum_{t1}^{t2} \frac{d(V_p - V_{wf})}{dt},$$

where $V_{wf}(t)$ is the voltage at a substrate 100 (e.g., a wafer) as a function of time and $V_p(t)$ is the voltage of the plasma 160 (also referred to as plasma potential) as a function of time, and $\theta_2$ is calculated as $f(\phi_{wf})$ (in other words, as a function of $\phi_{wf}(t)$ (the phase angle of the voltage at the substrate 100 as a function of time. In various embodiments, $V_{wf}(t)$ is measured by a wafer level voltage sensor (or VI sensor) 140 (see above, FIG. 1), $V_p(t)$ is measured by the voltage sensor 140, a capacitive probe 142 (see above, FIG. 1), or an OES sensor 144 (see above, FIG. 1), and $\phi_{wf}(t)$ is measured by the wafer level voltage sensor (or VI sensor) 140.

Figure 15:
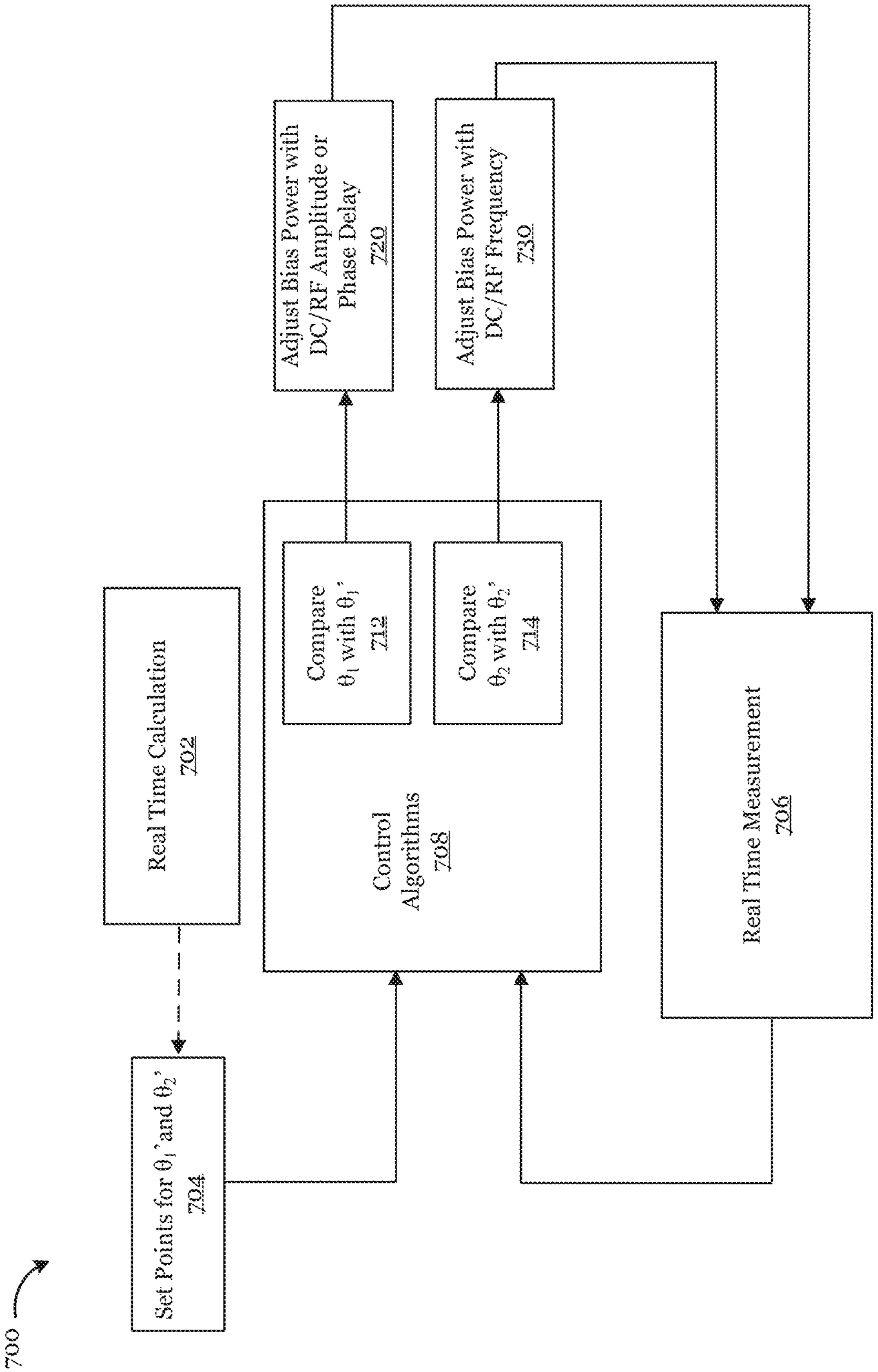
FIG. 15 illustrates a feedback control algorithm, in accordance with some embodiments.

FIG. 15 illustrates a feedback control algorithm 700, in accordance with some embodiments. In various embodiments, the feedback control algorithm 700 is performed in a plasma processing system 10 (see above, FIG. 1) by a controller 170 (for example, as program instructions stored in a memory of the controller 170) coupled with an RF bias power source 130, a DC power source 190, and one or more sensors such as a voltage sensor 140, a capacitive probe 142, and/or an OES sensor 144.

In step 702, real time calculation is performed for determining parameters of a desired ion energy distribution function, such as a desired ion energy peak, a desired ion energy spread or width, and a desired ion flux. These parameters may be determined in real time by the controller 170 based on desired performance of a plasma 160 for a plasma process (e.g., an advanced 3 nm node process such as a gate or HARC process). New desired parameters may be provided in real time, such as in response to changing plasma process chamber conditions or the progress of plasma processes being performed (e.g., etches, depositions, or the like).

In step 704, desired values $\theta_1'$ and $\theta_2'$ for objective functions $\theta_1$ and $\theta_2$ are set. The desired values $\theta_1'$ and $\theta_2'$ may be set to reduce or eliminate the surface charging effect on a substrate 100 being processed by the plasma processing system 10 and to synchronize the damped voltage for ions in the plasma 160 and the sheath voltage on the substrate 100, respectively. The desired values $\theta_1'$ and $\theta_2'$ may be advantageous for achieving desired parameters of the ion energy distribution function of the plasma 160, as described above with respect to step 702. The desired values $\theta_1'$ and $\theta_2'$ are provided to control algorithms (see below, step 708).

In step 706, real time measurement of the plasma 160 is performed, such as with one or more sensors such as a voltage sensor 140, a capacitive probe 142, and/or an OES sensor 144. Functions such as $V_{wf}(t)$, $V_p(t)$, and $\phi_{wf}(t)$ are measured in real time and provided as feedback to the control algorithms (see below, step 708).

In step 708, control algorithms use the real time measurements from step 706 to determine the real time values of the objective functions $\theta_1$ and $\theta_2$ for comparison with the desired values $\theta_1'$ and $\theta_2'$. The control algorithms perform sub-step 712 to compare $\theta_1$ with $\theta_1'$ and sub-step 714 to compare $\theta_2$ with $\theta_2'$, respectively.

In step 720, based on the comparison of $\theta_1$ with $\theta_1'$ in sub-step 712, the bias power of the tailored hybrid bias waveform is adjusted in order to reduce the difference between $\theta_1$ and $\theta_1'$. The tailored hybrid bias waveform may be adjusted by changing the amplitude or power of the DC power source 190 and/or the RF bias power source 130, by changing the phase delay between the outputs of the DC power source 190 and the RF bias power source 130, or by changing the duty cycle of the DC power source 190. The tailored feedback control algorithm 700 then returns to step 706 for additional real time measurement to provide feedback to the control algorithms.

In step 730, based on the comparison of $\theta_2$ with $\theta_2'$ in sub-step 714, the frequency of the tailored hybrid bias waveform is adjusted in order to reduce the difference between $\theta_2$ and $\theta_2'$. The tailored feedback control algorithm 700 then returns to step 706 for additional real time measurement to provide feedback to the control algorithms.

Figure 16:
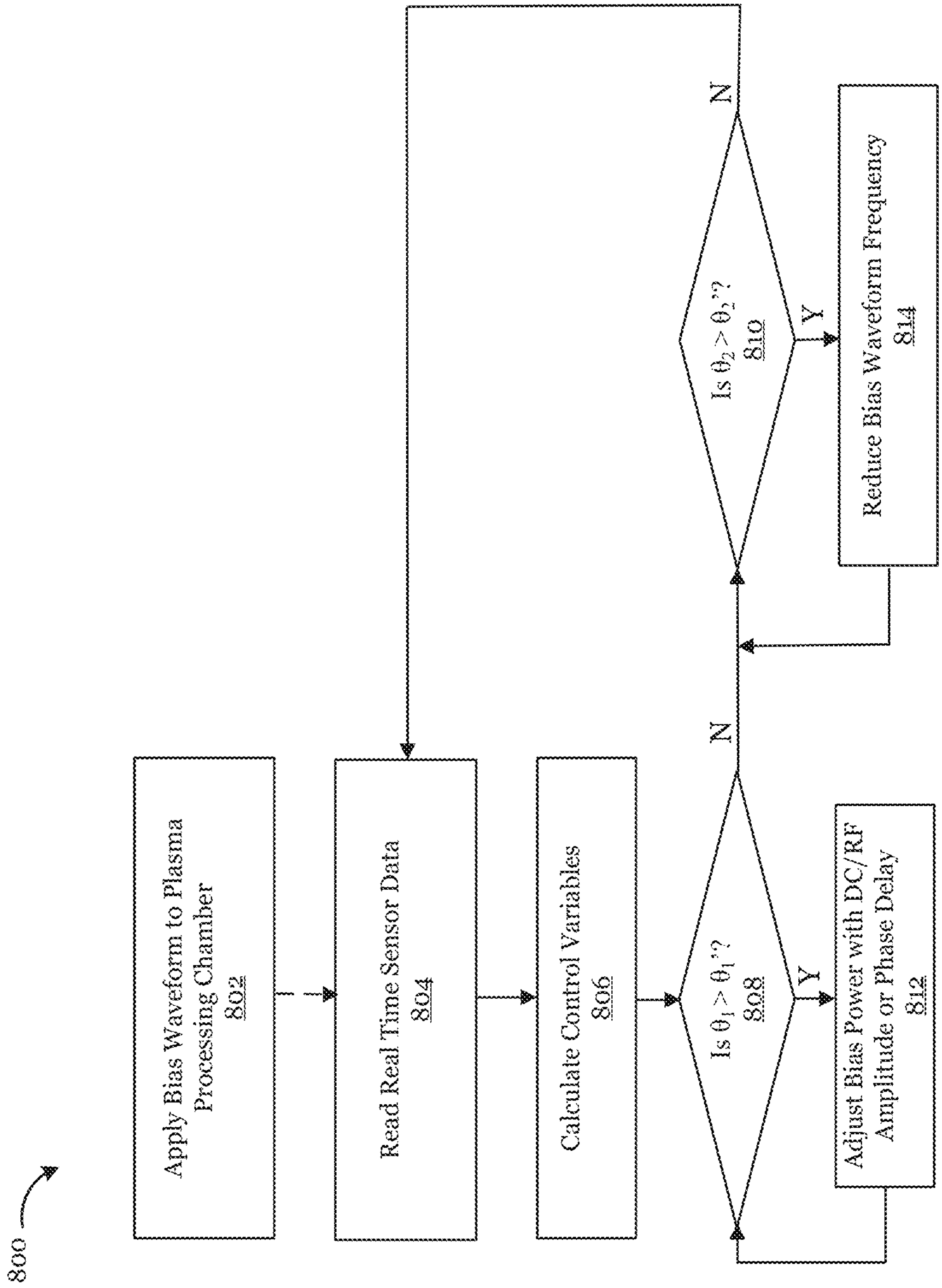
FIG. 16 illustrates a real time control loop, in accordance with some embodiments.

FIG. 16 illustrates a real time control loop 800, in accordance with some embodiments. In various embodiments, the real time control loop 800 is performed in a plasma processing system 10 (see above, FIG. 1) by a controller 170 (for example, as program instructions stored in a memory of the controller 170) coupled with an RF bias power source 130, a DC power source 190, and one or more sensors such as a voltage sensor 140, a capacitive probe 142, and/or an OES sensor 144. The real time control loop 800 may be implemented separately or in combination with the feedback control algorithm 700 as described above with respect to FIG. 15.

In step 802, a tailored hybrid bias waveform is provided to a plasma processing chamber 110, as described above with respect to FIGS. 1 and 12A-12E. Next, in step 804, real time sensor data (e.g., functions such as $V_{wf}(t)$, $V_p(t)$, and $\phi_{wf}(t)$) are read in real time in the plasma processing chamber 110 and provided to a controller 170. In step 806, following from step 804, objective functions (also referred to as control variables) $\theta_1$ and $\theta_2$ are calculated or generated by the controller 170 in real time using the real time sensor data.

In step 808, the controller 170 checks if $\theta_1$ is greater than a desired value $\theta_1'$. If $\theta_1$ is not greater than $\theta_1'$, the real time control loop 800 proceeds to step 810. If $\theta_1$ is greater than $\theta_1'$, the real time control loop 800 proceeds to step 812.

In step 810, the controller 170 checks if $\theta_2$ is greater than a desired value $\theta_2'$. If $\theta_2$ is not greater than $\theta_2'$, the real time control loop 800 returns to step 804 to continue the loop. If $\theta_2$ is greater than $\theta_2'$, the real time control loop 800 proceeds to step 814.

In step 812, the controller 170 adjusts the tailored hybrid bias waveform by changing the amplitude or power of the DC power source 190 and/or the RF bias power source 130, by changing the phase delay between the outputs of the DC power source 190 and the RF bias power source 130, or by changing the duty cycle of the DC power source 190. The real time control loop 800 then returns to step 808 to check if $\theta_1$ is greater than the desired value $\theta_2'$ again.

In step 814, the controller 170 adjusts the tailored hybrid bias waveform by changing the frequency of the tailored hybrid bias waveform. The real time control loop 800 then returns to step 810 to check if $\theta_2$ is greater than the desired value $\theta_{12}'$ again.

Although FIG. 16 illustrates step 808 being performed before step 810, in other embodiments step 810 is performed before step 808. The steps 808 through 814 may be performed in any suitable order, and all such orders are within the scope of the disclosed embodiments.

Figure 17:
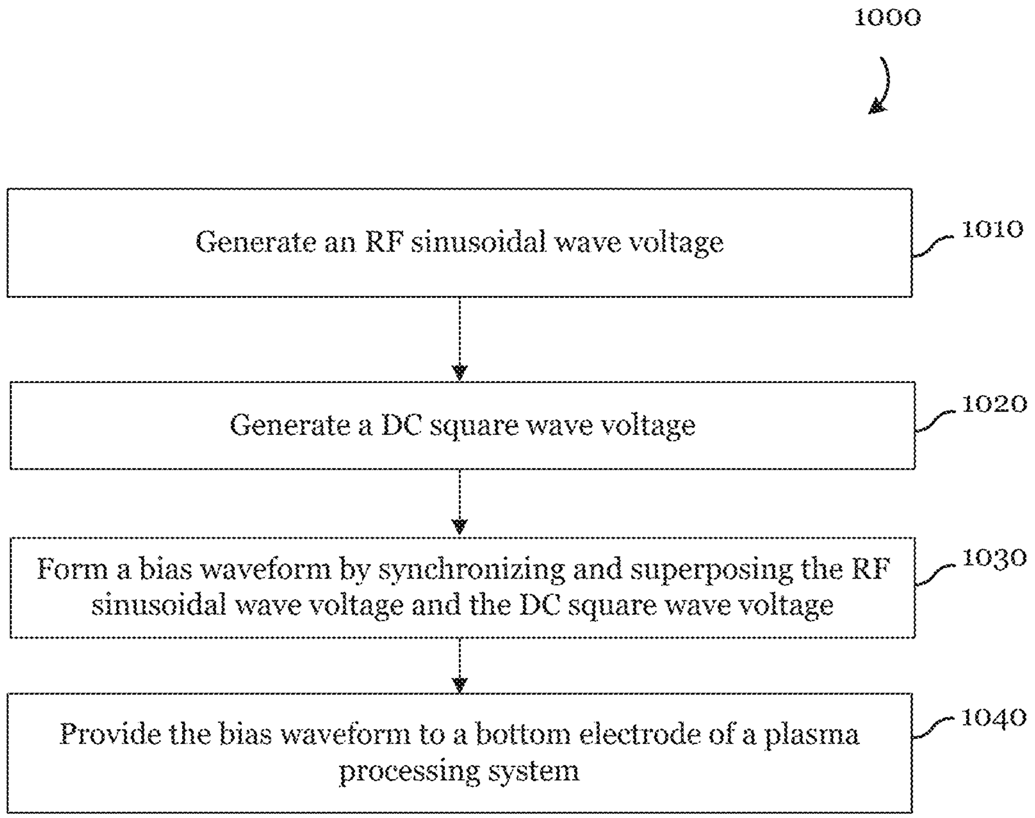
FIG. 17 illustrates a process flow chart diagram of a method for generating a bias voltage, in accordance with some embodiments.

FIG. 17 illustrates a process flow chart diagram of a method 1000 for generating a bias voltage, in accordance with some embodiments. In step 1010, a radio frequency (RF) sinusoidal wave voltage is generated, as described above with respect to FIGS. 1 and 4. In step 1020, a DC square wave voltage is generated, as described above with respect to FIGS. 1 and 4. In step 1030, a bias waveform is formed by synchronizing and superposing of the RF sinusoidal wave voltage and the DC square wave voltage, as described above with respect to FIG. 5. In step 1040, the bias waveform is provided to a bottom electrode of a plasma processing system, as described above with respect to FIGS. 1 and 5.

Figure 18:
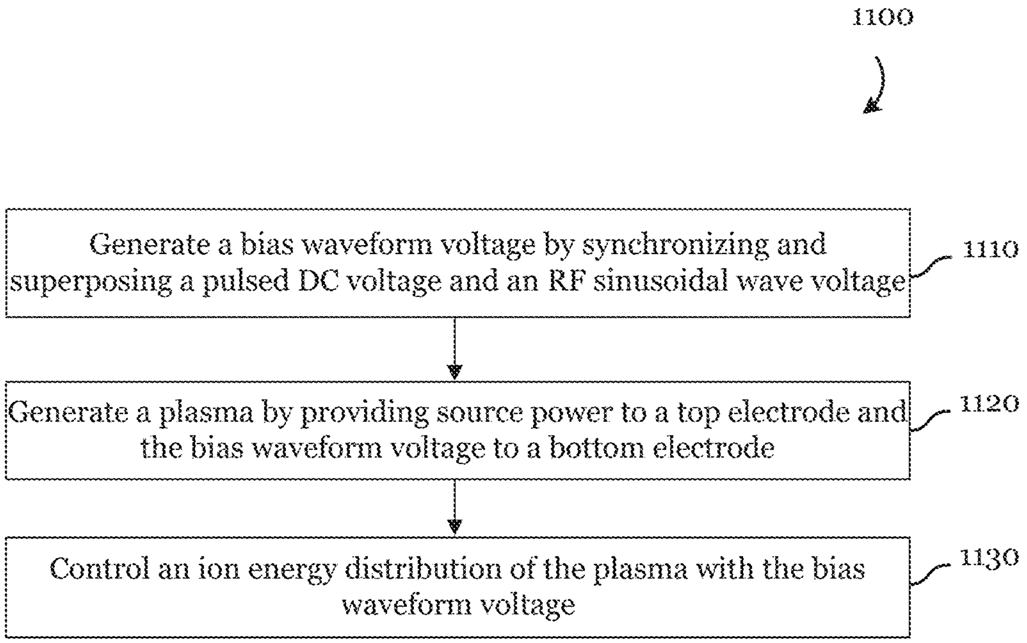
FIG. 18 illustrates a process flow chart diagram of a method for plasma processing, in accordance with some embodiments.

FIG. 18 illustrates a process flow chart diagram of a method 1100 for plasma processing, in accordance with some embodiments. In step 1110, a bias waveform voltage is generated by synchronizing and superposing a pulsed DC voltage and an RF sinusoidal wave voltage at a single frequency, as described above with respect to FIGS. 4 and 5. In step 1120, a plasma is generated in a plasma processing chamber by providing source power to a top electrode of the plasma processing chamber and providing the bias waveform voltage to a bottom electrode of the plasma processing chamber, as described above with respect to FIG. 1. In step 1130, an ion energy distribution of the plasma is controlled with the bias waveform voltage, as described above with respect to FIGS. 6A-6B, 7A-7B, 8A-8B, and 9A-9D.

Figure 19:
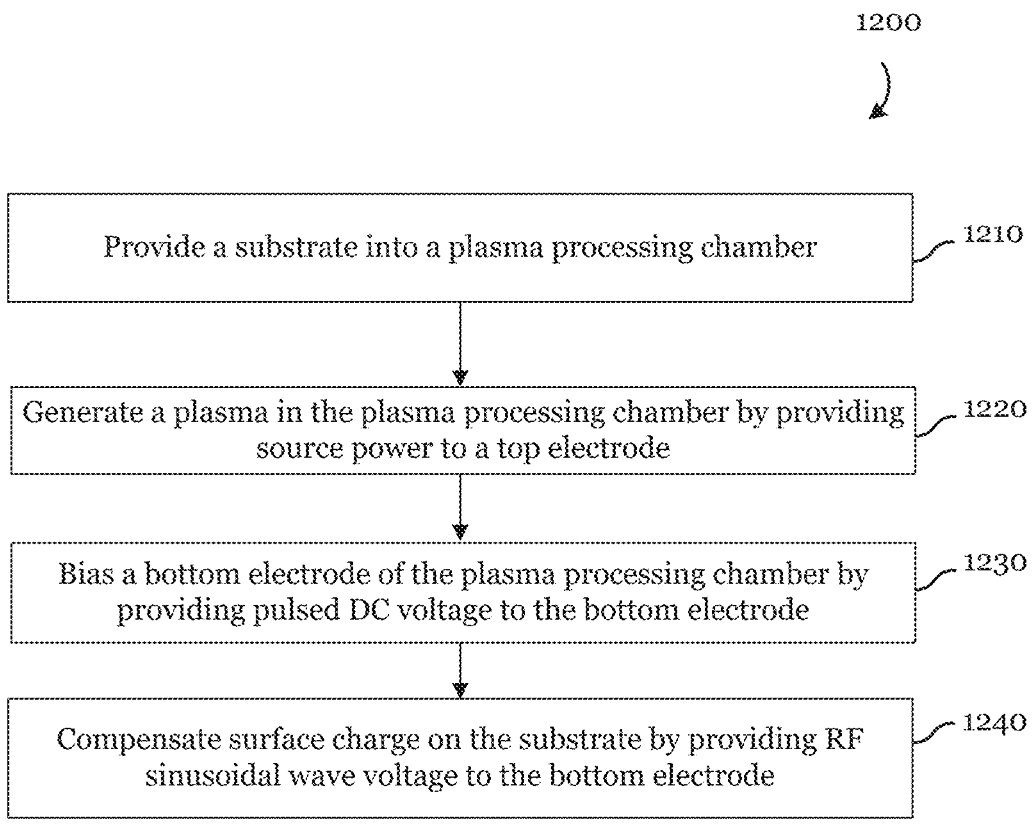
FIG. 19 illustrates a process flow chart diagram of a method for plasma processing, in accordance with some embodiments.

FIG. 19 illustrates a process flow chart diagram of a method 1200 for plasma processing, in accordance with some embodiments. In step 1210, a substrate is provided into a plasma processing chamber, as described above with respect to FIG. 1. In step 1220, a plasma is generated in the plasma processing chamber by providing source power to a top electrode of the plasma processing chamber, as described above with respect to FIG. 1. In step 1230, a bottom electrode of the plasma processing chamber is biased by providing pulsed DC voltage to the bottom electrode, as described above with respect to FIG. 1. In step 1240, surface charge on the substrate is compensated for by providing RF sinusoidal wave voltage to the bottom electrode, as described above with respect to FIGS. 6A-6C. The pulsed DC voltage and the RF sinusoidal wave voltage have a shared frequency.

Figure 20:
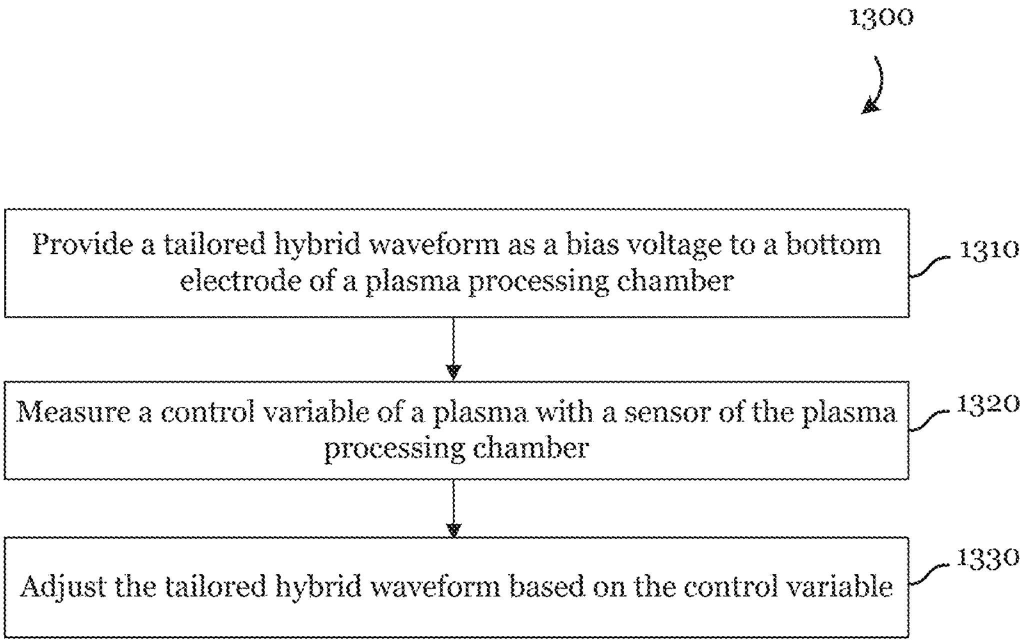
FIG. 20 illustrates a process flow chart diagram of a method for plasma processing, in accordance with some embodiments.

FIG. 20 illustrates a process flow chart diagram of a method 1300 for plasma processing, in accordance with some embodiments. In step 1310, a tailored hybrid waveform is provided as a bias voltage to a bottom electrode of a plasma processing chamber, as described above with respect to FIGS. 1 and 12A-12E. In step 1320, a control variable of a plasma is measured with a sensor of the plasma processing chamber, as described above with respect to FIG. 13. In step 1330, the tailored hybrid waveform is adjusted based on the control variable, as described above with respect to FIGS. 14A-14B.

Example embodiments of the disclosure are summarized here. Other embodiments can also be understood from the entirety of the specification as well as the claims filed herein.

Example 1. A method for generating a bias voltage, the method including: generating a radio frequency (RF) sinusoidal wave voltage; generating a DC square wave voltage; forming a bias waveform by synchronizing the RF sinusoidal wave voltage and the DC square wave voltage; and providing the bias waveform to a bottom electrode of a plasma processing system.

Example 2. The method of example 1, where the RF sinusoidal wave voltage and the DC square wave voltage have a same frequency.

Example 3. The method of example 2, where the same frequency is in a range of 50 kHz to 100 MHz.

Example 4. The method of one of examples 1 to 3, where the RF sinusoidal wave voltage and the DC square wave voltage are synchronized at a same phase.

Example 5. The method of one of examples 1 to 3, where the RF sinusoidal wave voltage and the DC square wave voltage are synchronized at different phases.

Example 6. The method of one of examples 1 to 5, where the plasma processing system uses pulsed plasma processing.

Example 7. The method of one of examples 1 to 5, where the plasma processing system uses continuous wave plasma processing.

Example 8. The method of one of examples 1 to 7, where the bias waveform compensates surface charge on a substrate in the plasma processing system.

Example 9. A method for plasma processing, the method including: generating a bias waveform voltage by synchronizing a pulsed DC voltage and an RF sinusoidal wave voltage at a single frequency; generating a plasma in a plasma processing chamber by providing source power to a top electrode of the plasma processing chamber and providing the bias waveform voltage to a bottom electrode of the plasma processing chamber; and controlling an ion energy distribution of the plasma with the bias waveform voltage.

Example 10. The method of example 9, where controlling the ion energy distribution of the plasma with the bias waveform voltage includes adjusting an amplitude of the pulsed DC voltage.

Example 11. The method of example 10, where adjusting the amplitude of the pulsed DC voltage controls a location of a peak energy of the ion energy distribution.

Example 12. The method of one of examples 9 to 11, where controlling the ion energy distribution of the plasma with the bias waveform voltage includes adjusting an amplitude of the RF sinusoidal wave voltage.

Example 13. The method of example 12, where adjusting the amplitude of the RF sinusoidal wave voltage controls a width of an ion energy spread of the ion energy distribution.

Example 14. The method of one of examples 9 to 13, where controlling the ion energy distribution of the plasma with the bias waveform voltage includes adjusting duty cycles of the RF sinusoidal wave voltage and the pulsed DC voltage.

Example 15. The method of example 14, where adjusting the duty cycles of the RF sinusoidal wave voltage and the pulsed DC voltage controls an ion flux of the ion energy distribution.

Example 16. The method of one of examples 9 to 15, where the bias waveform voltage includes sinusoidal horizontal segments between vertical segments in a graph of voltage versus time.

Example 17. A method for plasma processing, the method including: providing a substrate into a plasma processing chamber; generating a plasma in the plasma processing chamber by providing source power to a top electrode of the plasma processing chamber; biasing a bottom electrode of the plasma processing chamber by providing pulsed DC voltage to the bottom electrode; and compensating surface charge on the substrate by providing RF sinusoidal wave voltage to the bottom electrode, the pulsed DC voltage and the RF sinusoidal wave voltage having a shared frequency.

Example 18. The method of example 17, where the shared frequency of the pulsed DC voltage and the RF sinusoidal wave voltage is in a range of 50 kHz to 100 MHz.

Example 19. The method of one of examples 17 or 18, where the pulsed DC voltage is modulated to set a peak ion energy for an ion energy distribution of the plasma.

Example 20. The method of one of examples 17 to 19, where, while the pulsed DC voltage is on, a voltage of the substrate is kept constant by the RF sinusoidal wave voltage.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for generating a bias voltage, the method comprising:

generating a radio frequency (RF) sinusoidal wave voltage;

generating a DC square wave voltage;

forming a bias waveform by synchronizing the RF sinusoidal wave voltage and the DC square wave voltage, wherein the RF sinusoidal wave voltage and the DC square wave voltage have the same frequency, wherein the bias waveform is a combination of the RF sinusoidal wave voltage and the DC square wave voltage; and providing the bias waveform to a bottom electrode of a plasma processing system.

2. The method of claim 1, wherein the same frequency is in a range of 50 kHz to 100 MHz.

3. The method of claim 1, wherein the RF sinusoidal wave voltage and the DC square wave voltage are synchronized at a same phase.

4. The method of claim 1, wherein the RF sinusoidal wave voltage and the DC square wave voltage are synchronized at different phases.

5. The method of claim 1, wherein the plasma processing system uses pulsed plasma processing.

6. The method of claim 1, wherein the plasma processing system uses continuous wave plasma processing.

7. The method of claim 1, wherein the bias waveform compensates surface charge on a substrate in the plasma processing system.

8. The method of claim 1, wherein the bias waveform comprises sinusoidal horizontal segments between straight vertical segments, wherein the sinusoidal horizontal segments share endpoints with the straight vertical segments.

9. A method for plasma processing, the method comprising:

generating a bias waveform voltage by synchronizing a pulsed DC voltage and an RF sinusoidal wave voltage at a single frequency;

generating a plasma in a plasma processing chamber by providing source power to a top electrode of the plasma processing chamber and providing the bias waveform voltage to a bottom electrode of the plasma processing chamber, wherein the bias waveform voltage is a superposition of the pulsed DC voltage and the RF sinusoidal wave voltage; and controlling an ion energy distribution of the plasma with the bias waveform voltage.

10. The method of claim 9, wherein controlling the ion energy distribution of the plasma with the bias waveform voltage comprises adjusting an amplitude of the pulsed DC voltage.

11. The method of claim 10, wherein adjusting the amplitude of the pulsed DC voltage controls a location of a peak energy of the ion energy distribution.

12. The method of claim 9, wherein controlling the ion energy distribution of the plasma with the bias waveform voltage comprises adjusting an amplitude of the RF sinusoidal wave voltage.

13. The method of claim 12, wherein adjusting the amplitude of the RF sinusoidal wave voltage controls a width of an ion energy spread of the ion energy distribution.

14. The method of claim 9, wherein controlling the ion energy distribution of the plasma with the bias waveform voltage comprises adjusting duty cycles of the RF sinusoidal wave voltage and the pulsed DC voltage.

15. The method of claim 14, wherein adjusting the duty cycles of the RF sinusoidal wave voltage and the pulsed DC voltage controls an ion flux of the ion energy distribution.

16. The method of claim 9, wherein the bias waveform voltage comprises sinusoidal horizontal segments between vertical segments in a graph of voltage versus time.

17. A method for plasma processing, the method comprising:

providing a substrate into a plasma processing chamber;

generating a plasma in the plasma processing chamber by providing source power to a top electrode of the plasma processing chamber;

biasing a bottom electrode of the plasma processing chamber by providing pulsed DC voltage to the bottom electrode; and compensating surface charge on the substrate by providing RF sinusoidal wave voltage to the bottom electrode, the pulsed DC voltage and the RF sinusoidal wave voltage having a shared frequency.

18. The method of claim 17, wherein the shared frequency of the pulsed DC voltage and the RF sinusoidal wave voltage is in a range of 50 kHz to 100 MHz.

19. The method of claim 17, wherein the pulsed DC voltage is modulated to set a peak ion energy for an ion energy distribution of the plasma.

20. The method of claim 17, wherein, while the pulsed DC voltage is on, a voltage of the substrate is kept constant by the RF sinusoidal wave voltage.

* * * * *